(12) United States Patent
Kitazume et al.

(10) Patent No.: US 8,441,271 B2
(45) Date of Patent: May 14, 2013

(54) CONTACTOR AND METHOD OF PRODUCTION OF CONTACTOR

(75) Inventors: Hidenori Kitazume, Tokyo (JP); Koji Asano, Tokyo (JP)

(73) Assignee: Advantest Corporation, Tokyo (JP)

( * ) Notice: Subject to any disclaimer, the term of this patent is extended or adjusted under 35 U.S.C. 154(b) by 688 days.

(21) Appl. No.: 12/532,928

(22) PCT Filed: Mar. 12, 2008

(86) PCT No.: PCT/JP2008/054526
§ 371 (c)(1),
(2), (4) Date: Sep. 24, 2009

(87) PCT Pub. No.: WO2008/120547
PCT Pub. Date: Oct. 9, 2008

(65) Prior Publication Data
US 2010/0102838 A1    Apr. 29, 2010

(30) Foreign Application Priority Data
Apr. 3, 2007 (JP) .................................. 2007-097396

(51) Int. Cl.
*G01R 31/20* (2006.01)

(52) U.S. Cl.
USPC .................................................. 324/754.01

(58) Field of Classification Search ............ 324/755.01–755.11, 762.01–762.1, 324/754.01–754.3; 257/48; 438/14–18
See application file for complete search history.

(56) References Cited

U.S. PATENT DOCUMENTS

| | | | |
|---|---|---|---|
| 5,977,783 A | 11/1999 | Takayama et al. | |
| 6,255,727 B1 | 7/2001 | Khoury | |
| 6,420,884 B1 * | 7/2002 | Khoury et al. | 324/755.01 |
| 6,436,802 B1 | 8/2002 | Khoury | |
| 6,462,283 B1 * | 10/2002 | Hirai et al. | 174/260 |
| 6,646,455 B2 * | 11/2003 | Maekawa et al. | 324/754.03 |
| 7,609,052 B2 | 10/2009 | Mizushima et al. | |
| 7,764,152 B2 | 7/2010 | Kuitani et al. | |
| 7,859,248 B2 | 12/2010 | Kaneko | |
| 2002/0008535 A1 * | 1/2002 | Masuda | 324/765 |
| 2004/0119485 A1 | 6/2004 | Koch et al. | |
| 2007/0013390 A1 | 1/2007 | Kuitani et al. | |
| 2010/0126289 A1 | 5/2010 | Kinoshita | |
| 2010/0194420 A1 | 8/2010 | Kitazume et al. | |
| 2010/0304559 A1 | 12/2010 | Kuitani et al. | |

FOREIGN PATENT DOCUMENTS

| | | |
|---|---|---|
| JP | 7-321169 | 12/1995 |
| JP | 2000-180471 | 6/2000 |
| JP | 2000-249722 | 9/2000 |
| JP | 2001-91539 | 4/2001 |

(Continued)

OTHER PUBLICATIONS

International Search Report for International Application No. PCT/JP2008/054526.
Chinese office action from corresponding Chinese family member application.

(Continued)

*Primary Examiner* — Tung X Nguyen
(74) *Attorney, Agent, or Firm* — Greenblum & Bernstein, P.L.C.

(57) ABSTRACT

A contactor includes: a silicon layer composing a part of beam part with a rear end side provided at a base part and with a front end side sticking out from the base part; $SiO_2$ layer as an insulating layer formed on the silicon layer; and a conductive layer formed on the $SiO_2$ layer.

30 Claims, 42 Drawing Sheets

FOREIGN PATENT DOCUMENTS

| | | |
|---|---|---|
| JP | 2001-159642 | 6/2001 |
| JP | 2003-222638 | 8/2003 |
| JP | 2004/205511 | 7/2004 |
| WO | 03/071289 | 8/2003 |
| WO | 2007/000799 | 1/2007 |

OTHER PUBLICATIONS

Taiwanese Office Action dated Dec. 25, 2012 in counterpart application No. 97109445.

* cited by examiner

DICING

CONTACTOR AND METHOD OF PRODUCTION OF CONTACTOR

TECHNICAL FIELD

The present invention relates to a contactor for contacting pads, electrodes, leads, or other input/output terminals provided at an integrated circuit or other electrical circuit formed on a semiconductor wafer, semiconductor chip, printed circuit board, etc. (hereinafter also referred to representatively as an "IC device") and establishing an electrical connection with the IC device when testing an IC device and a method of production of such a contactor.

BACKGROUND ART

A large number of semiconductor integrated circuit devices are built in a silicon wafer etc., then are diced, bonded, packaged, and otherwise processed to form finished electronic devices. These IC devices are subjected to operational tests before shipment. These IC tests are run in the state of the finished products and in the state of the wafer.

When testing an IC device in the wafer state, probe needles (hereinafter also referred to as "contactors") provided on a probe card of the electronic device test apparatus are brought into contact with the IC device to establish an electrical connection with the IC device. The contactors are required to be provided with conductivity and elasticity for destroying the oxide film formed on the input/output terminals of the IC device to secure electrical contact.

As such a contactor, a silicon finger contactor comprises: beam parts made of silicon (Si) with rear end sides provided at a base part and with front end sides sticking out from the base part; and nickel-cobalt layers formed at the surfaces of the beam parts has been known in the past (for example, see Patent Literatures 1 to 3).

In this silicon finger contactor, the nickel-cobalt layers are used to secure the electrical connection with input/output terminals of the IC device and secure the majority of the elasticity of the contactor. However, nickel-cobalt is a metal material, so repeated contact with input/output terminals of an IC device results in plastic deformation. When such plastic deformation accumulates, the height of the front end part of the contactor (contact part) from a surface of the probe card becomes lower. For this reason, along with repeated tests, the contact state between the IC device and the contactor changes and it is impossible to perform accurate tests in some cases.

Further, the nickel-cobalt layers expand due to heat by the effects of the thermal stress applied to the IC device at the time of testing, so the difference in heat expansion from the silicon composing the beam parts causes warping in the silicon finger contactor and deviation in the height of the front end parts contacting the IC device with respect to the IC device in some cases.

Patent Literature 1: Japanese Patent Publication (A) No. 2000-249722

Patent Literature 2: Japanese Patent Publication (A) No. 2001-159642

Patent Literature 3: International Publication No. 03/071289 pamphlet

SUMMARY OF INVENTION

Technical Problem

An object of the present invention is to provide a contactor enabling heights of front end parts to be maintained over a long period of time and a good test precision to be secured.

(1) According to a first aspect of the present invention, there is provided a contactor for contacting an input/output terminal provided at a device under test for establishing electrical connection with the device under test at the time of testing the device under test, the contactor comprising: a silicon layer composing at least a part of a beam part with a rear end side provided at a base part and with a front end side sticking out from the base part; an insulating layer formed on the silicon layer; and a conductive layer formed on the insulating layer (see claim 1).

In the present invention, since no metal layer serving as a member imparting elasticity to the contactor is included, it is possible to conduct tests with good accuracy when using the contactor over a long period of time without plastic deformation occurring in the contactor.

While the present invention is not particularly limited to this, preferably the conductive layer includes a seed layer formed on the insulating layer and a first Au plated layer formed on the seed layer (see claim 2).

While the present invention is not particularly limited to this, preferably the contactor further comprises a contact part positioned at a front end of the conductive layer and contacting the input/output terminal of the IC device under test (see claim 3).

While the present invention is not particularly limited to this, preferably at least a surface of the contact part is composed of a conductive material harder than Au composing a first Au plated layer (see claim 4). Since the contact part contacts the input/output terminals of an IC device, it is possible to stably perform tests over a long period of time without the first Au plated layer being damaged.

While the present invention is not particularly limited to this, preferably the contact part is formed in the shape of a curved surface (see claim 5).

While the present invention is not particularly limited to this, preferably the contact part swells up with respect to the conductive layer (see claim 6).

While the present invention is not particularly limited to this, preferably the contact part has a first plated layer composed of Ni (see claim 7).

While the present invention is not particularly limited to this, preferably the contact part has a second plated layer covering at least a contacting portion between the first plated layer and the conductive layer (see claim 8).

While the present invention is not particularly limited to this, preferably the second plated layer is composed of Rh, Pt, Ru, Pd, or Ir (see claim 9).

While the present invention is not particularly limited to this, preferably the second plated layer covers the entire first plated layer, and the contact part further has a third plated layer covering the second plated layer (see claim 10).

While the present invention is not particularly limited to this, preferably the second plated layer is composed of Au, and the third plated layer is composed of Rh, Pt, Ru, Pd, or Ir (see claim 11).

While the present invention is not particularly limited to this, preferably the insulating layer has a thickness of 1 μm or more (see claim 12). Due to this, it is possible to impart good high frequency characteristics to the contactor.

While the present invention is not particularly limited to this, preferably the conductive layer has a second Au plated layer formed on the first Au plated layer at the rear end side of the beam part, and the Au purity of the second Au plated layer is higher than the Au purity of the first Au plated layer (see claim 13).

According to the present invention, there is provided a probe card comprising: probe needles for electrical contact with input/output terminals of a device under test built into a semiconductor wafer when testing the device under test; and a board on which a large number of the probe needles are mounted, wherein the probe needles are composed of the above-mentioned contactors (see claim 14).

According to the present invention, there is provided an electronic device test apparatus for testing a semiconductor device formed on a semiconductor wafer, the electronic device test apparatus comprising: the above-mentioned probe card; a test head electrically connected to the probe card; and a prober moving the semiconductor wafer relative to the probe card (see claim 15).

(2) According to a second aspect of the present invention, there is provided a method of production of a contactor for contacting an input/output terminal provided at a device under test for establishing electrical connection with the device under test when testing the device under test, the method of production of the contactor comprising: a silicon layer forming step of etching a silicon wafer so as to form a silicon layer composing at least a part of a beam part with a rear end part provided at a base part and with a front end side sticking out from the base part; an insulating layer forming step of forming an insulating layer on a surface of the silicon layer; and a conductive layer forming step of forming a conductive layer on the insulating layer (see claim 16).

In the present invention, since no metal layer serving as a member imparting elasticity to the contactor is included, it is possible to conduct tests with good accuracy when using the contactor over a long period of time without plastic deformation occurring in the contactor.

While the present invention is not particularly limited to this, preferably the conductive layer forming step includes a seed layer forming step of forming a seed layer on the insulating layer, and a first Au plated layer forming step of forming a first Au plated layer on the seed layer (see claim 17).

While the present invention is not particularly limited to this, preferably the method further comprises a contact part forming step of forming a contact part contacting the input/output terminal of an IC device at a front end of the conductive layer (see claim 18).

While the present invention is not particularly limited to this, preferably at least the surfaces of the contact part is composed of a conductive material harder than Au composing a first Au plated layer (see claim 19).

While the present invention is not particularly limited to this, preferably the contact part forming step includes a first plating step of plating at least from the front end part of the first Au plated layer to the surface of the seed layer by Ni plating so as to form a curved shaped first plating layer composed of Ni (see claim 20).

While the present invention is not particularly limited to this, preferably the contact part forming step further includes a second plating step of forming a second plated layer covering at least a contacting portion between the first plated layer and the conductive layer by plating (see claim 21)

While the present invention is not particularly limited to this, preferably the second plated layer is composed of Rh, Pt, Ru, Pd, or Ir (see claim 22).

While the present invention is not particularly limited to this, preferably the second plated step has forming the second plated layer so as to cover the entire first plated layer, and the contact part forming step further includes a third plating step of plating the second plated layer to form a third plated layer (see claim 23).

While the present invention is not particularly limited to this, preferably the second plated layer is composed of Au, and the third plated layer is composed of Rh, Pt, Ru, Pd, or Ir (see claim 24).

While the present invention is not particularly limited to this, preferably the second plating step and the third plating step are consecutively performed without removing the resist used in the second plating step (see claim 25). Due to this, it is possible to cut the resist removal time and the resist formation time and possible to shorten the time for production of the contactor.

While the present invention is not particularly limited to this, preferably the method further comprises a milling step of milling the seed layer so as to remove an exposed part of the seed layer (see claim 26).

While the present invention is not particularly limited to this, preferably, the silicon layer forming step comprises performing the etching so that a scallop value of the silicon layer is 100 nm or less (see claim 27). For this reason, when the completed contactor is pressed against an IC device, it is possible to use the contactor for a long period of time without cracks or other damage occurring due to roughness of the surface.

While the present invention is not particularly limited to this, preferably a polyimide layer is formed as a resist on the top surface of the beam part, and the etching is performed from a bottom surface side of the silicon layer (see claim 28). A polyimide layer is extremely excellent in heat resistance, corrosion resistance, insulation, and mechanical strength, so it is possible to prevent leakage of cooling gas when the etching is completed or damage to the stage of the etching apparatus.

While the present invention is not particularly limited to this, preferably the polyimide layer is formed by forming a polyimide precursor layer on the top surface of the beam part and imidizing the polyimide precursor layer (see claim 29).

While the present invention is not particularly limited to this, preferably the polyimide layer is formed by sticking a polyimide film on the top surface of the beam part using a tackifier (see claim 30).

While the present invention is not particularly limited to this, preferably the method further comprises: a first sticking step of sticking a first tape on the top surface of the beam part; and a cutting step of cutting the silicon wafer in the state where the first tape is stuck on the top surface of the beam part (see claim 31). For this reason, it is possible to prevent damage to the beam part due to water pressure. Further, when becoming unnecessary, it is possible to use ultraviolet light to easily remove foaming separation tape.

While the present invention is not particularly limited to this, the first tape is ultraviolet light foaming tape with a tackifier which foams by irradiation of ultraviolet light, and the method further comprises a first separation step of separating the first tape by irradiation of ultraviolet light (see claim 32).

While the present invention is not particularly limited to this, preferably the method further comprises a second sticking step of sticking a second tape on a bottom surface of the base part (see claim 33). Due to this, handling of the silicon finger contactor after dicing becomes easy. Further, when becoming unnecessary, it is possible to easily remove the ultraviolet light curing separation tape by ultraviolet light.

While the present invention is not particularly limited to this, preferably the second tape is ultraviolet light separation tape with a tackifier curing by irradiation of ultraviolet light, and the method further comprises a second separation step of separating the second tape by irradiation of ultraviolet light (see claim 34).

While the present invention is not particularly limited to this, preferably the silicon layer has a 1 kΩ·m or more resistivity (see claim 35). Due to this, it is possible to impart good high frequency characteristics to the contactor.

REFERENCE SIGNS LIST

1 . . . electronic device test apparatus
   10 . . . test head
      11 . . . printed circuit board
      12 . . . connector
   20 . . . interface part
      21 . . . intermediate board
         21b . . . interconnect pattern
      22 . . . frog ring
         22a . . . pogo pin
      30 . . . flexible board
   40 . . . probe card
      41 . . . probe board
         41a . . . through hole
         41b . . . connection trace
         41c . . . bonding wire
      42 . . . stiffener
   50 . . . silicon finger contactor (probe needle)
      51 . . . base part
      52 . . . step
      53 . . . beam part
      54 . . . conductive layer
         54a . . . seed layer
         54b . . . first Au plated layer
         54c . . . high purity Au plated layer
         54d . . . Ni plated layer
         54e . . . second Au plated layer
         54f . . . Rh plated layer
      55 . . . front end part
      56 . . . silicon wafer (SOI wafer)
         56a . . . $SiO_2$ layer
         56b . . . Si layer
         56c . . . $SiO_2$ layer
         56d . . . Si layer
         56e . . . $SiO_2$ layer
      57a to 57i . . . resist layer
      58 . . . polyimide layer
      59 . . . foaming separation tape
      60 . . . UV separation tape
   90 . . . tester
      91 . . . cable bundle
   100 . . . prober
      101 . . . chuck
   110 . . . manipulator
      111 . . . drive motor
200 . . . silicon wafer (wafer under test)

DESCRIPTION OF EMBODIMENTS

Below, an embodiment of the present invention will be explained based on the drawings.

Figure 1:
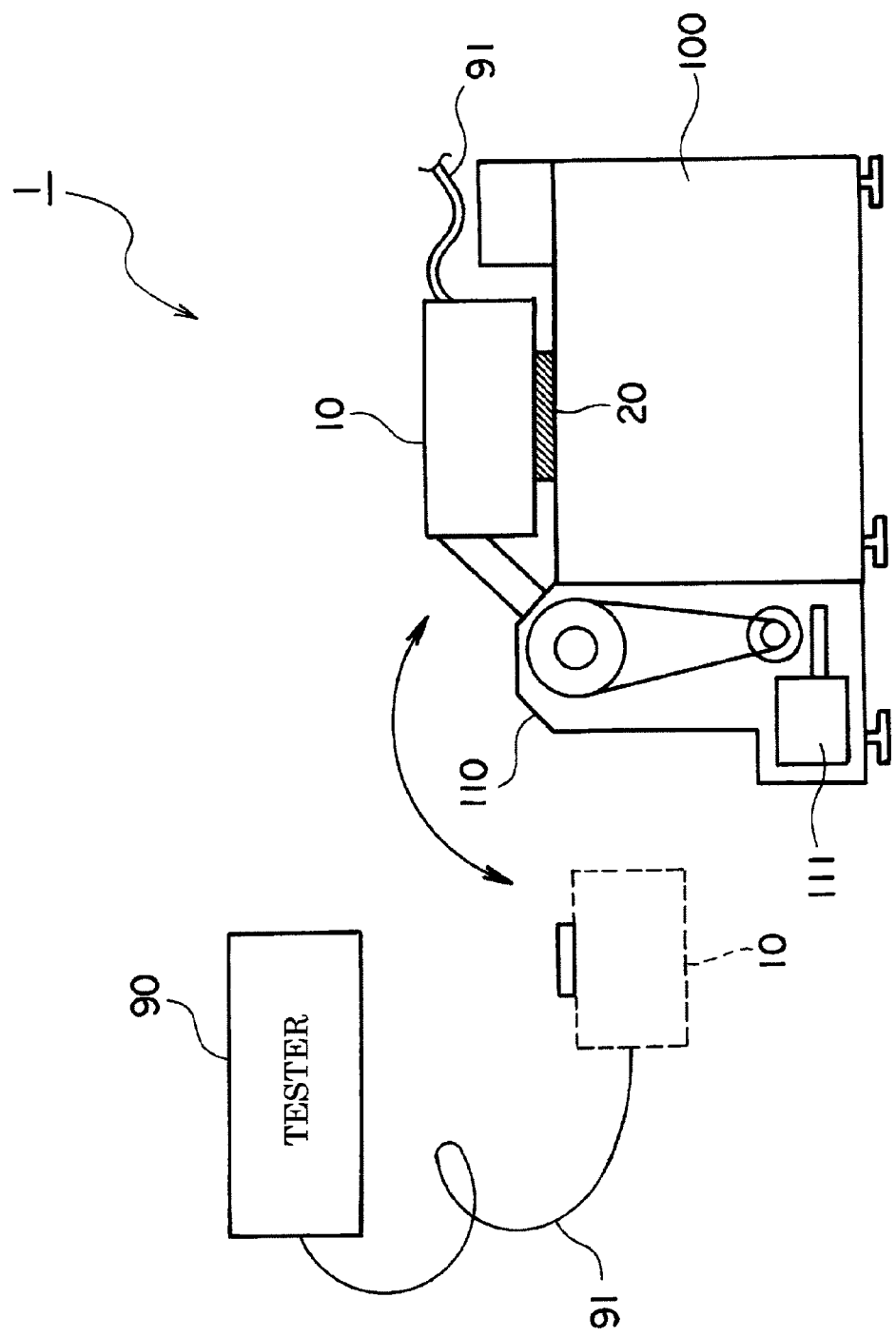
FIG. 1 is a schematic view showing a test apparatus in an embodiment of the present invention.
Figure 2:
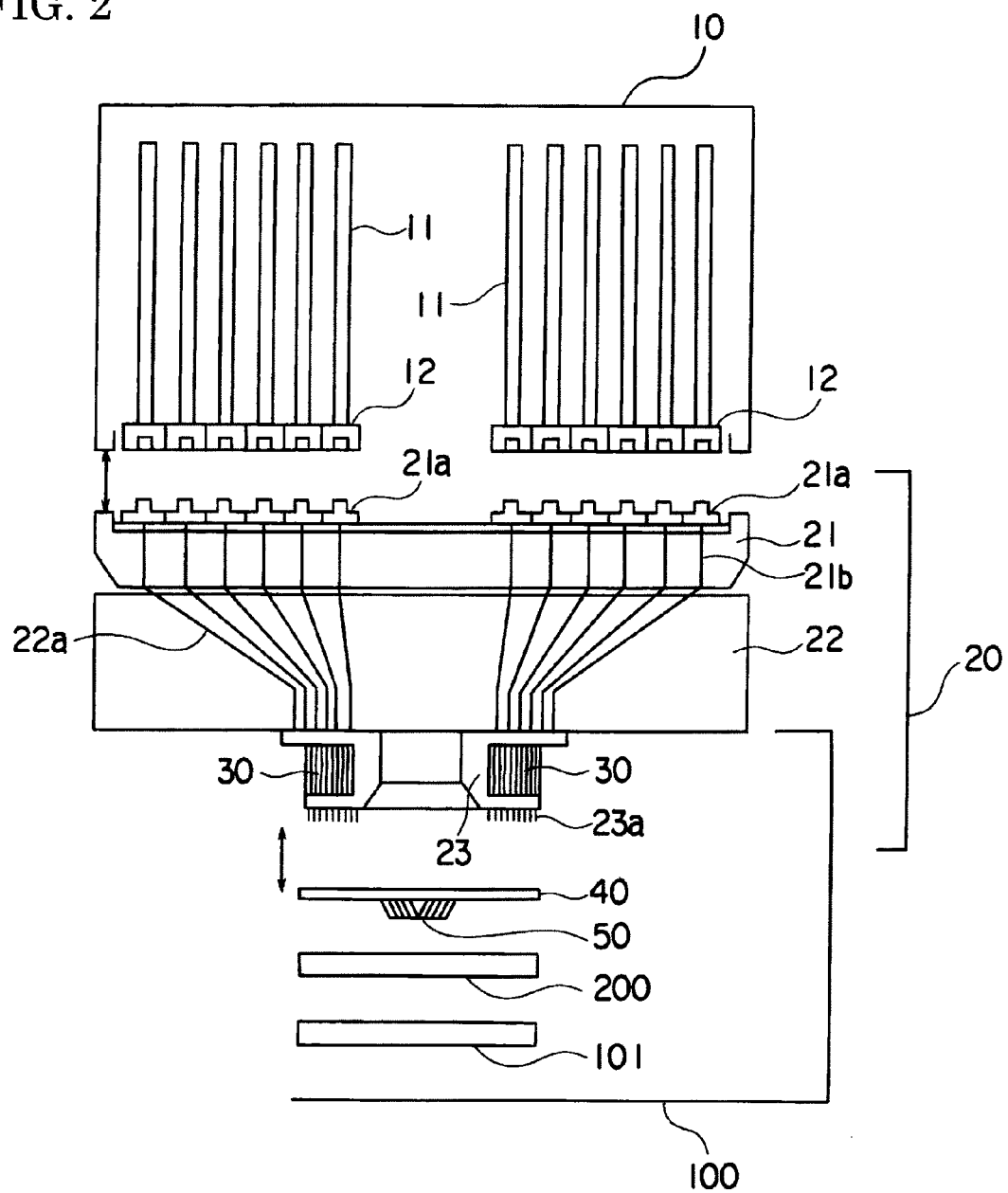
FIG. 2 is a conceptual view showing the connection relationship between a test head and probe card used in the test apparatus of FIG. 1.

FIG. 1 is a schematic view showing a test apparatus in an embodiment of the present invention, while FIG. 2 is a conceptual view showing the connection relationship between a test head and a probe card used in the test apparatus of FIG. 1.

The test apparatus 1 according to the present embodiment, as shown in FIG. 1, comprises a test head 10, a tester 90 (test apparatus body), and a prober 100. The tester 90 is electrically connected through a cable bundle 91 to the test head 10 and can input and output DC signals or digital signals to and from an IC device built in a silicon wafer (hereinafter also referred to as a "wafer under test") 200. The test head 10 is arranged on a prober 100 by a manipulator 110 and drive motor 111.

As shown in FIG. 1 and FIG. 2, a large number of printed circuit boards 11 are provided inside the test head 10. These printed circuit boards 11 are connected to the tester 90 through a cable bundle 91 having several hundred internal cables. Further, each printed circuit board 11 is electrically connected to a connector 12 for connection with a mother board 21 and can be electrically connected to contact terminals 21a on the mother board 21 of an interface part 20.

The test head 10 and the prober 100 are connected through the interface part 20. This interface part 20 comprises the mother board 21, a wafer performance board 22, and a frog ring 23. The mother board 21 is provided with contact terminals 21a for electrical connection with connectors 12 on the test head 10 side and is formed with interconnect patterns 21b for electrical connection of the contact terminals 21a and the wafer performance board 22. The wafer performance board 22 is electrically connected to the mother board 21 through pogo pins etc. Interconnect patterns 22a are formed to convert the pitch of the interconnect patterns 21a on the mother board 21 to the pitch at the frog ring 23 side and electrically connect the interconnect patterns 21a to a flexible board 30 provided in the frog ring 23.

The frog ring 23 is provided on the wafer performance board 22. To enable some positioning between the test head 10 and the prober 100, an internal conveyance path is composed of the flexible board 30. A large number of pogo pins 23a to which this flexible board 30 is electrically connected are mounted at the bottom surface of the frog ring 23.

A probe card 40 with the bottom surface on which a large number of silicon finger contactors 50 are mounted is attached to the frog ring 23. The pogo pins 23a electrically connect the probe card 40 and the frog ring 23.

The prober 100 is configured to be able to hold a wafer 200 under test on a chuck 101 and automatically feed the wafer 200 under test to a position facing the probe card 40 mounted on the test head 10.

In the above configured electronic device test apparatus 1, the probe card 40 is pushed against the wafer 200 under test held on the chuck 101, and the silicon finger contactors 50 are brought into electrical contact with the input/output terminals of an IC device built in the wafer 200 under test. In that state, a DC signal and digital signal are supplied from the tester 90 to the IC device and the output signal is received from the IC device. The output signals from the IC device (response signal) are compared with the expected values in the tester 90 to evaluate the electrical characteristics of the IC device. Note that, the electronic device test apparatus in the present invention is not particularly limited to the configuration explained here.

Figure 3:
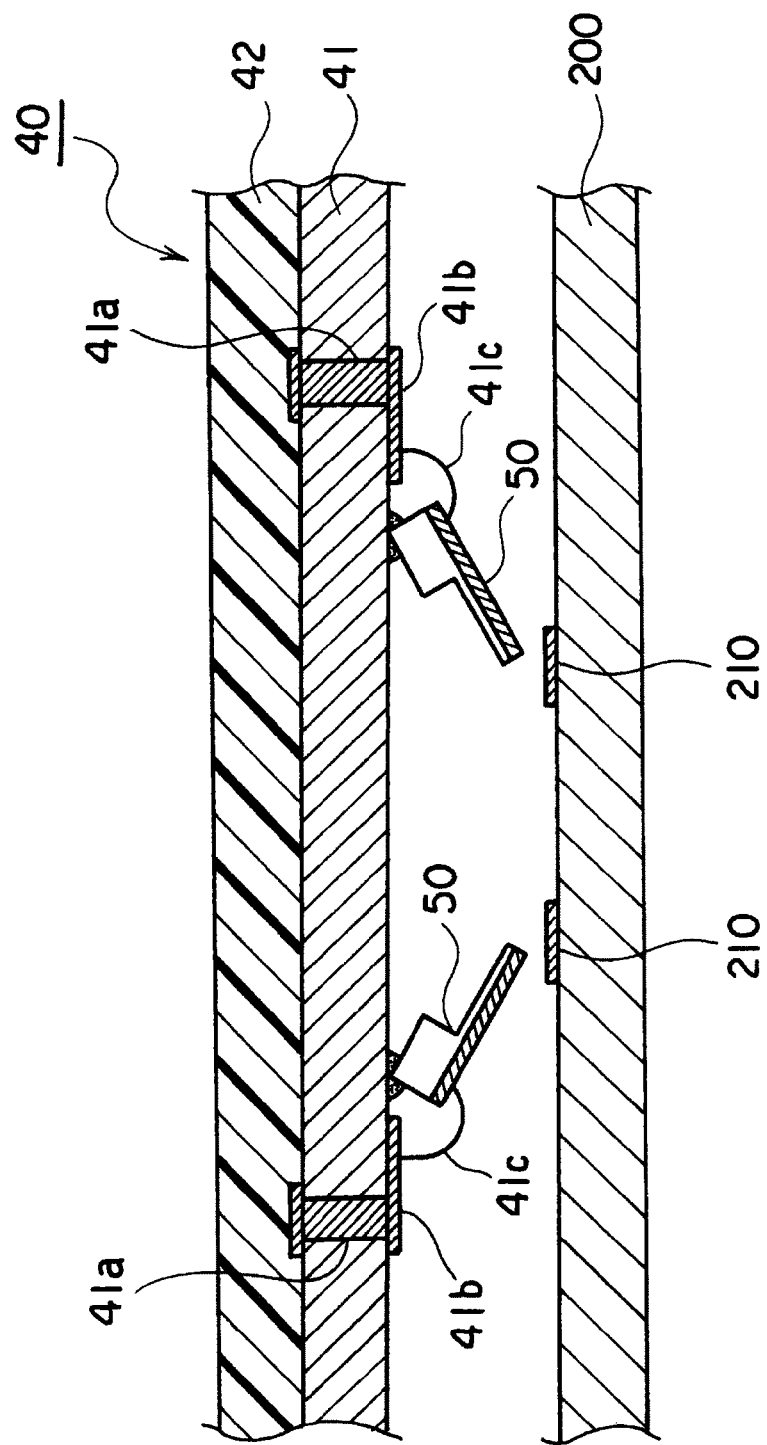
FIG. 3 is a cross-sectional view of a probe card in an embodiment of the present invention.
Figure 4:
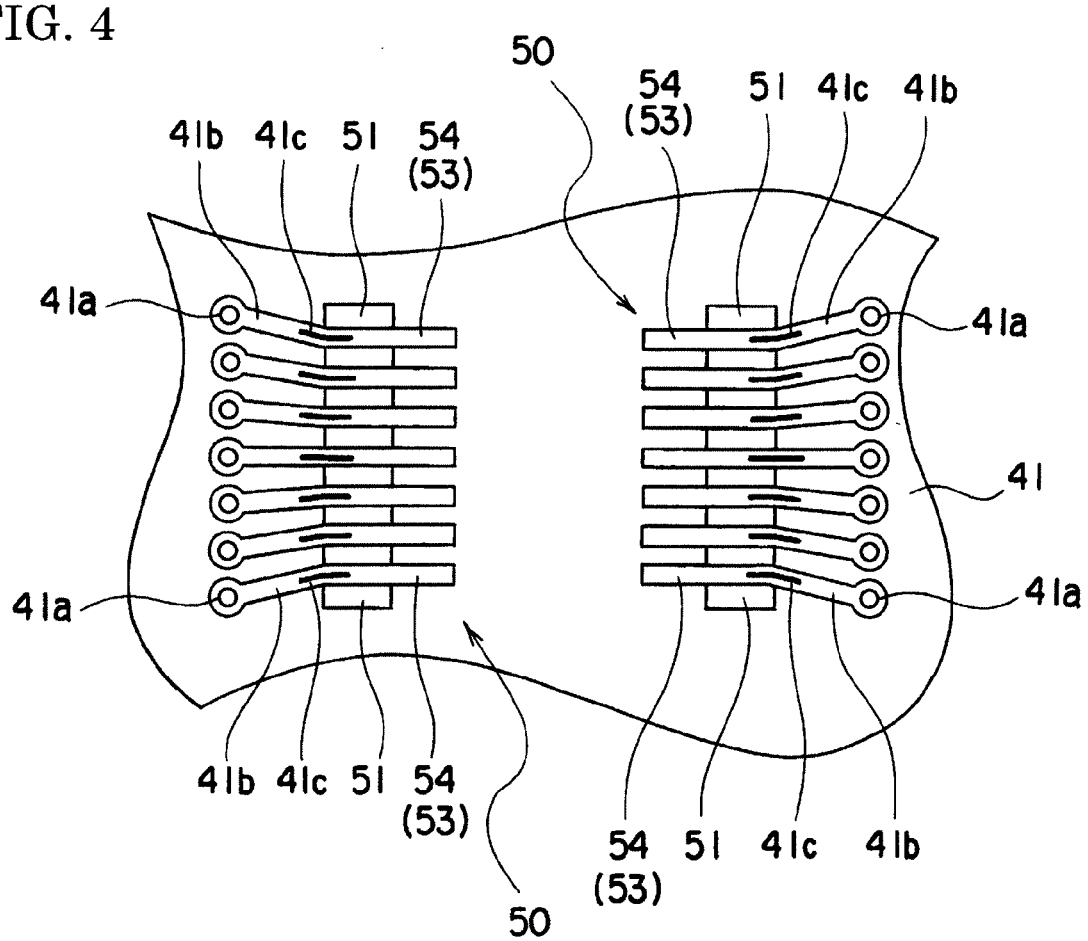
FIG. 4 is a partial bottom view of a probe card shown in FIG. 3.
Figure 5:
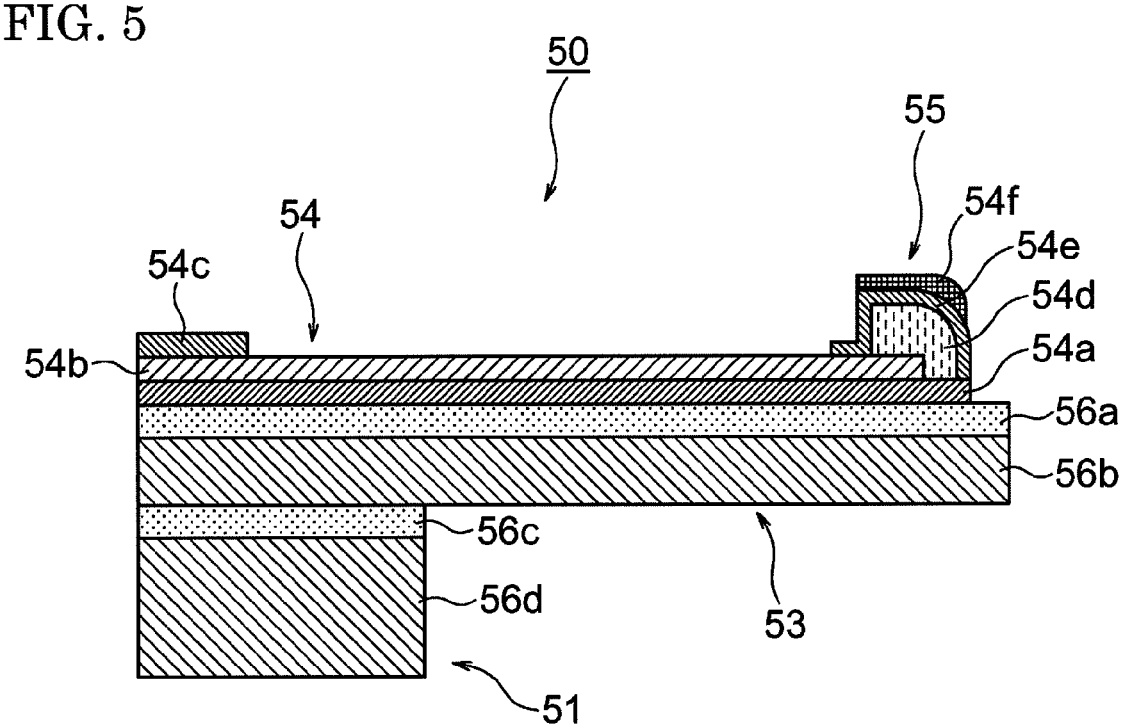
FIG. 5 is a cross-sectional view showing a silicon finger contactor in an embodiment of the present invention.
Figure 6:
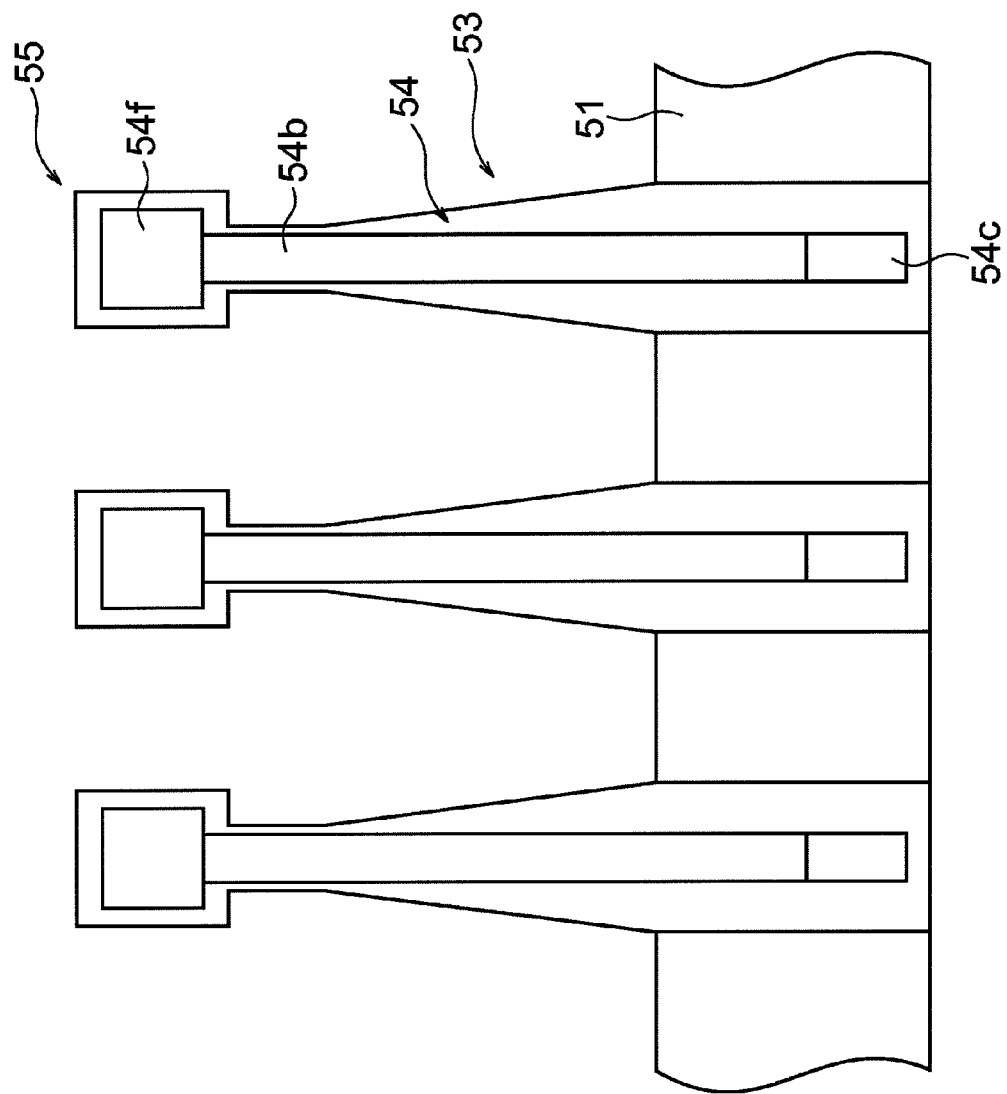
FIG. 6 is a plan view of a silicon finger contactor shown in FIG. 5.

FIG. 3 is a cross-sectional view of a probe card in an embodiment of the present invention, FIG. 4 is a partial bottom view of a probe card shown in FIG. 3, FIG. 5 is a cross-sectional view showing a silicon finger contactor in an embodiment of the present invention, and FIG. 6 is a plan view of a silicon finger contactor shown in FIG. 5.

The probe card 40 in the present embodiment, as shown in FIG. 3 and FIG. 4, for example, comprises: a probe board 41 comprised of a multilayer circuit board etc.; a stiffener 42 mounted on the top surface of the probe board 41 for reinforcing the mechanical strength; and a large number of silicon finger contactors 50 mounted on the bottom surface of the probe board 41

The probe board 41 is formed with through holes 41a so as to pass through from the bottom surface to the top surface and is formed with connection traces 41b connected to the through holes 41a at the bottom surface. Note that, the probe card in the present invention is not particularly limited to the configuration explained here.

Each silicon finger contactor 50, as shown in FIG. 5, comprises: a base part 51 fixed on the probe board 40; beam parts 43 with rear end sides provided at the base part 51 and front end sides sticking out from the base part 51; conductive layers 54 formed on the front surfaces of the base part 51 and beam parts 53; and contact parts 55 formed at the front ends of the conductive layers 54.

Note that, in the present embodiment, the "rear end side" in a silicon finger contactor 50 indicates the side contacting the probe board 40 (left side in FIG. 5). As opposed to this, the "front end side" in a silicon finger contactor 50 indicates the side contacting input/output terminals 210 of the IC device formed on the wafer 200 under test (right side in FIG. 5).

The base part 51 and beam parts 53 of this silicon finger contactor 50, as explained later, are produced using photolithography or other semiconductor production technology on a silicon wafer (hereinafter also referred to as a "semiconductor wafer") 56. Further, as shown in FIG. 6, a single base part 51 is provided with a plurality of tapered diagonal columnar beam parts 53 in finger shapes (comb shape). By using semiconductor production technology to produce a silicon finger contactor 50 in this way, it is possible to easily match the pitch between the plurality of beam parts 53 with the narrow pitch between the input/output terminals 210 on the wafer 200 under test.

The beam parts 53 comprises: an Si layer 56b composed of silicon; and an SiO$_2$ layer 56a formed on the Si layer 56b and functioning as an insulating layer. The Si layer 56b has a thickness of 50 to 100 μm. Due to this, the beam parts 53 are provided with suitable elasticity for the contactor.

A conductive layer 54 is formed on the surface of the insulating layer 56a. The conductive layer 54, as shown in FIG. 6, comprises: a seed layer 54a composed of Ti and Au; a first Au plated layer 54b composed of Au; and a high purity Au plated layer 54c including high purity Au. The first Au plated layer 54b has a thickness of 4 to 10 μm. If the thickness of the first Au plated layer 54b is less than 5 μm, heat ends up being emitted. On the other hand, if the thickness of the first Au plated layer 54b is larger than 10 μm, warping ends up occurring.

Further, the contact parts 55 are formed sticking out at the front ends of the conductive layers 54. The contact parts 55 comprises: an Ni plated layer 54d formed on the surface of the first Au plated layer 54b using Ni; a second Au plated layer 54e formed on the surface of the Ni plated layer 54d using Au; and an Rh plated layer 54f formed on the surface of the second Au plated layer 54e using Rh.

The above configured silicon finger contactor 50, as shown in FIG. 3, is mounted on the probe board 41 so as to face input/output terminals 210 of an IC device built in the test wafer 200. Note that, FIG. 3 only shows two silicon finger contactors 50, but in actuality a larger number of silicon finger contactors 50 are arranged on the probe board 41.

The silicon finger contactor 50, as shown in FIG. 3, is bonded to the probe board 41 in a state with abutting the corner part of the base part 51 against the surface of the probe board 41. Further, the silicon finger contactor 50 is electrically connected through the high purity Au plated layer 54c to the connection trace 41b by wire bonding 41c. As the adhesive for mounting the contactor 50A on the probe board 41, for example, an ultraviolet light curing adhesive, temperature curing adhesive, thermoplastic adhesive, etc. may be mentioned. Further, instead of the wire bonding 41c, it is also possible to use solder balls to electrically connect the conductive layer 54 and the connection trace 41b.

The test of an IC device using a probe card 40 of the above configuration is performed by using the prober 100 to push a wafer 200 under test against the probe card 40 and bring the silicon finger contactor 50 on the probe board 41 and the input/output terminals 210 on the wafer 200 under test into electrical contact.

Below, an example of the method of production of the silicon finger contactor 50 of the present embodiment will be explained using FIG. 7 to FIG. 39. FIG. 7 to FIG. 39 are cross-sectional views showing steps of the method of production of a silicon finger contactor in an embodiment of the present invention.

Figure 7:
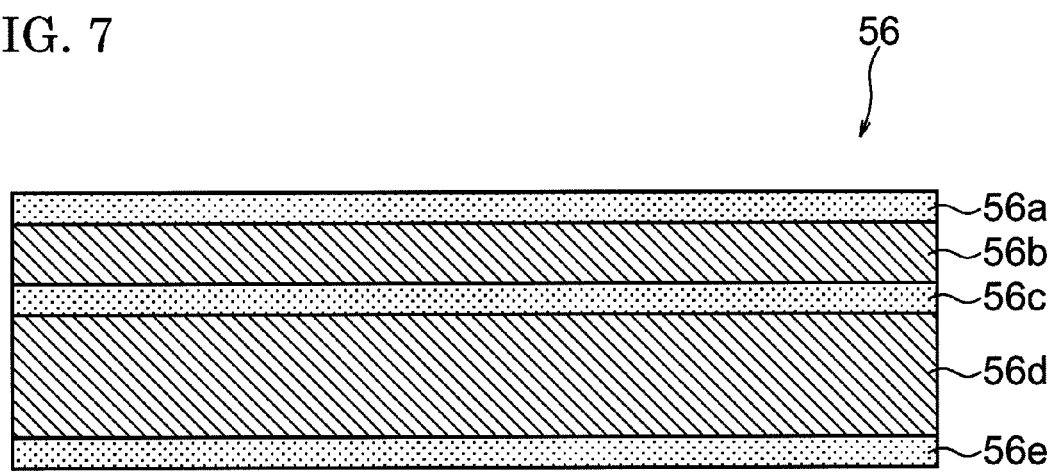
FIG. 7 is a cross-sectional view showing a first step of a method of production of a silicon finger contactor in an embodiment of the present invention.

First, in the method of production in the present embodiment, an SOI wafer 56 is prepared at a first step shown in FIG. 7. This SOI wafer 56 is a silicon wafer composed of three layers of SiO$_2$ layers 56a, 56c, and 56e between which two layers of Si layers 56b and 56d are sandwiched. The SiO$_2$ layer 56a, 56c, and 56e of this SOI wafer have the functions of etching stoppers at the time of the later-explained etching and the functions as insulating layers so as to prevent electrical shorting between beam parts 53.

Here, to improve the high frequency characteristics of the finished silicon finger contactor 50, the thickness of the SiO$_2$ layer 56a is 1 μm or more. Further, the Si layer 56b is formed to have a 1 kΩ·cm or more volume resistivity so that the high frequency characteristics of the finished silicon finger contactor 50 is good.

Further, to impart good spring characteristics to the beam parts 53, the Si layer 56b and Si layer 56d are configured so that the tolerance of the thickness of the Si layer 56b is ±3 μm or less and the tolerance of the thickness of the Si layer 56d is ±1 μm or less.

Figure 8:
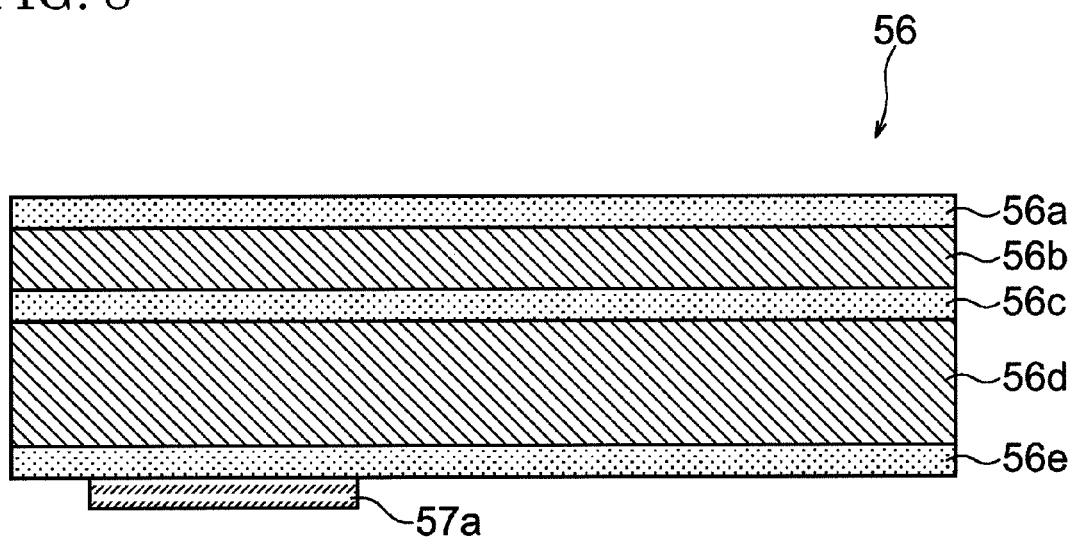
FIG. 8 is a cross-sectional view showing a second step of a method of production of a silicon finger contactor in an embodiment of the present invention.

Next, in a second step shown in FIG. 8, a resist layer 57a is formed as a mask material at the time of etching on the lower front surface of the silicon wafer 56.

As the material forming the resist film in the present embodiment, a photoresist which is a photosensitive material is used. A photoresist is a sticky liquid. Further, when the solvent is evaporated from this photoresist to form a layer shape, the exposed photoresist layer can be dissolved in an organic solvent.

This photoresist is coated using a spin coater, spray coater, etc. on the surface of the silicon wafer 56 whereby a photosensitive film of thin photoresist is formed.

Next, the silicon wafer 56 on which the photosensitive film is formed is heated, the solvent in the photoresist is removed by evaporation in a prebake process, and the photoresist is solidified.

Next, a mask member (not shown) on which patterns are formed is laid over the photosensitive film, and the photosensitive film is exposed by ultraviolet light. At this time, the parts (pattern parts) of the photosensitive film covered by patterns of the mask member are not exposed.

Next, the mask member is removed and the photosensitive film is immersed in an image developing solution in a development process. This development process is work performed for removing the photoresist other than at the pattern parts of the photosensitive film.

The silicon wafer 56 on which the pattern parts are formed by this development process is next rinsed by a rinse solution. This rinsing has the effect of stopping the development.

The finished rinsed silicon wafer 56 is heated for removing the solvent or water in the photoresist of the remaining photosensitive film in post baking, and the adhesiveness of the photosensitive film and silicon wafer 56 is enhanced. When this post baking ends, a resist layer 57a comprised of a photosensitive film is completed. This resist layer 57a is used as an etching mask pattern in the next third step.

Figure 9:
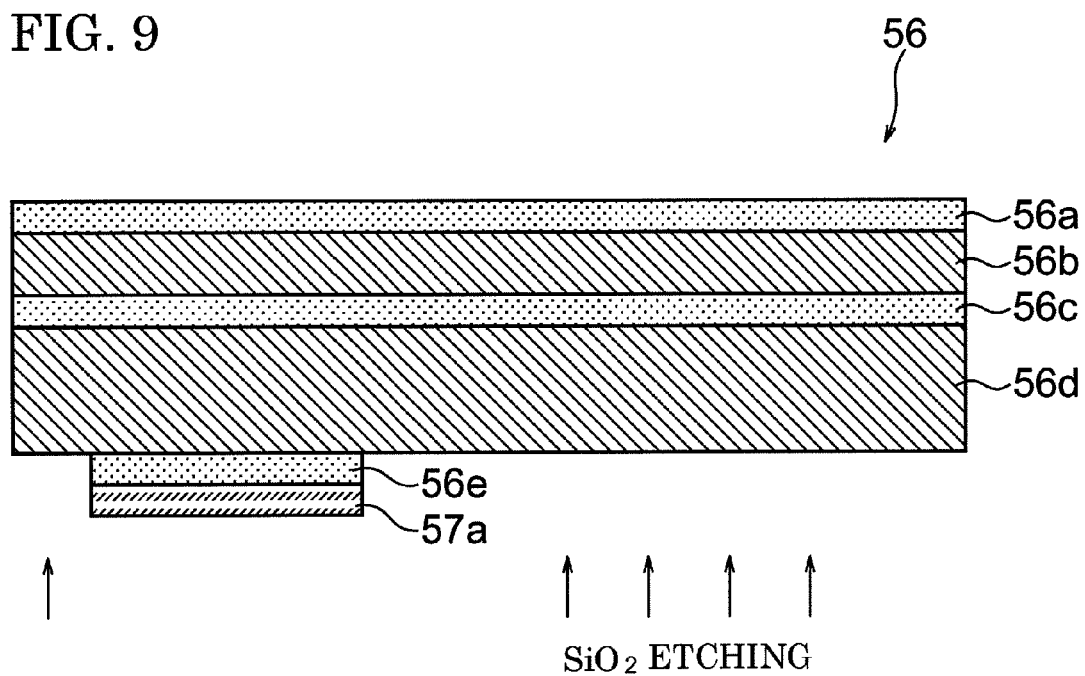
FIG. 9 is a cross-sectional view showing a third step of a method of production of a silicon finger contactor in an embodiment of the present invention.

Next, in a third step shown in FIG. 9, the SiO$_2$ layer 56e is dry etched from the lower direction in FIG. 9 to remove the SiO$_2$ layer (SiO$_2$ etching). Further, the SiO$_2$ layer 56e other than parts protected by the resist layer 57a is eroded.

Figure 10:
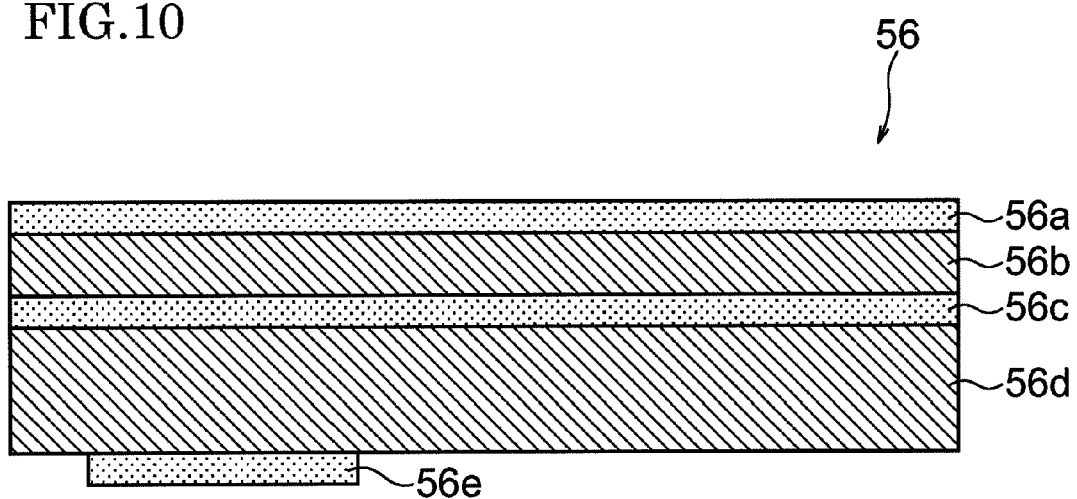
FIG. 10 is a cross-sectional view showing a fourth step of a method of production of a silicon finger contactor in an embodiment of the present invention.

Next, in a fourth step shown in FIG. 10, the resist layer 57a remaining at the SiO$_2$ layer 56e is removed (resist separation). In the present embodiment, this resist is separated using a plasma ashing apparatus ashing the resist by oxygen plasma. Further, the silicon wafer 56 is washed by a sulfuric acid-hydrogen peroxide mixture or an ammonia-hydrogen peroxide mixture after ashing.

Figure 11:
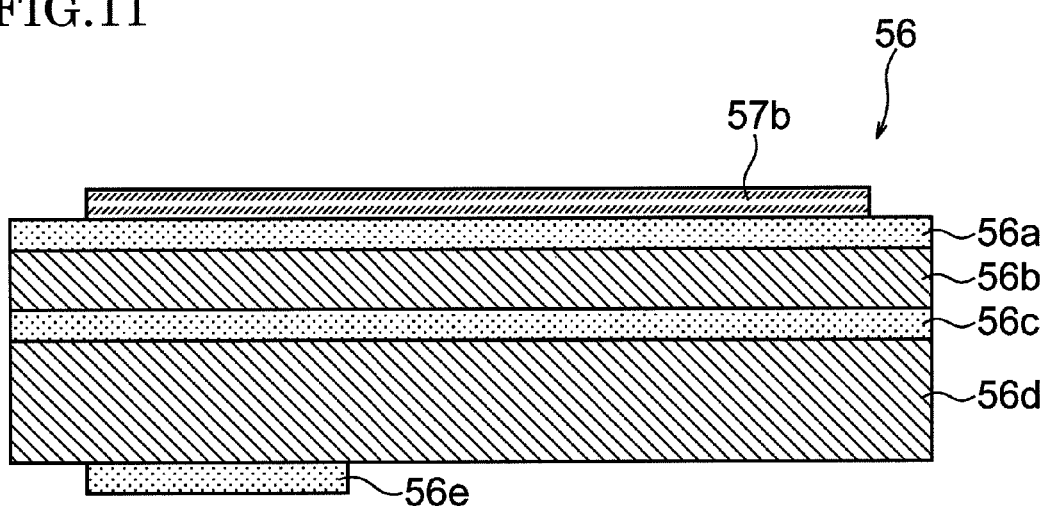
FIG. 11 is a cross-sectional view showing a fifth step of a method of production of a silicon finger contactor in an embodiment of the present invention.

Next, the resist layer 57b is formed on the surface of the SiO$_2$ layer 56a in a fifth step shown in FIG. 11. This resist layer 57b is formed by the same procedure as the formation of the resist layer 57a in the second step.

Figure 12:
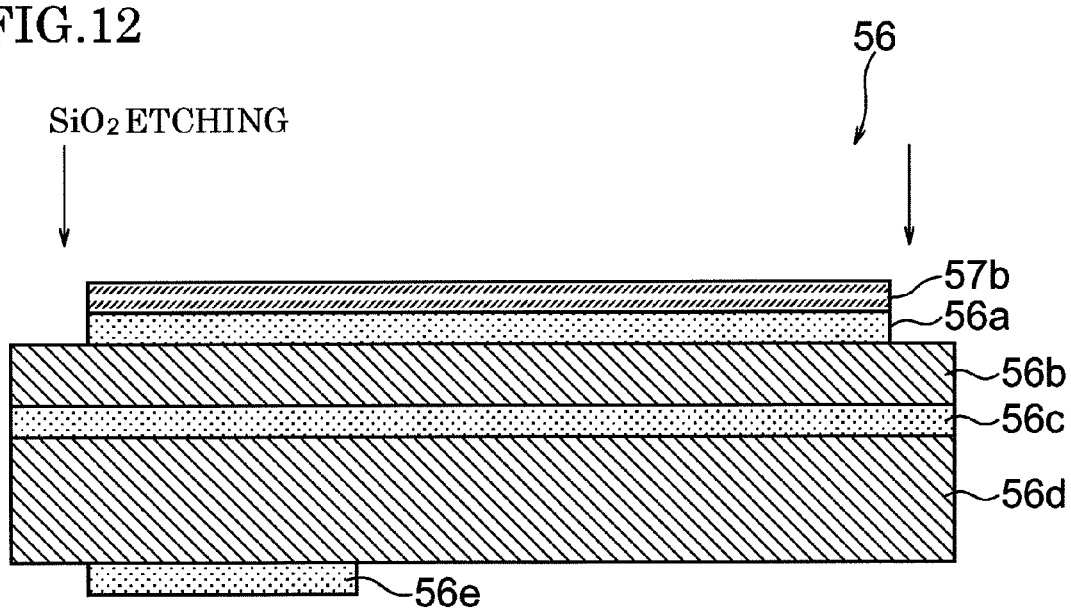
FIG. 12 is a cross-sectional view showing a sixth step of a method of production of a silicon finger contactor in an embodiment of the present invention.

Next, in a sixth step shown in FIG. 12, the SiO$_2$ layer 56a is SiO$_2$ etched from the upper side direction in FIG. 12. Further, the SiO$_2$ layer 56a is eroded into finger shapes (comb shape).

Figure 13:
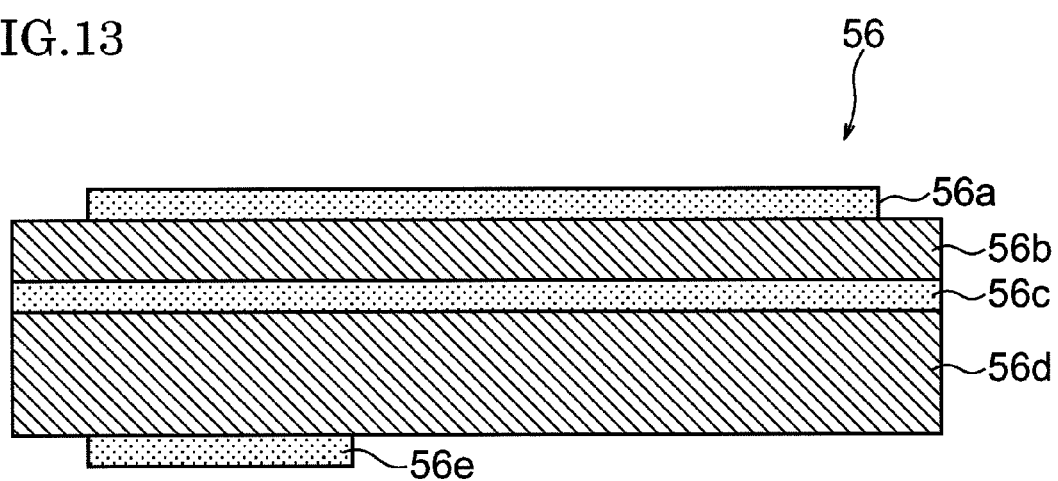
FIG. 13 is a cross-sectional view showing a seventh step of a method of production of a silicon finger contactor in an embodiment of the present invention.

Next, in a seventh step shown in FIG. 13, the resist layer 57b is removed by the same procedure as the above-mentioned fourth step.

Figure 14:
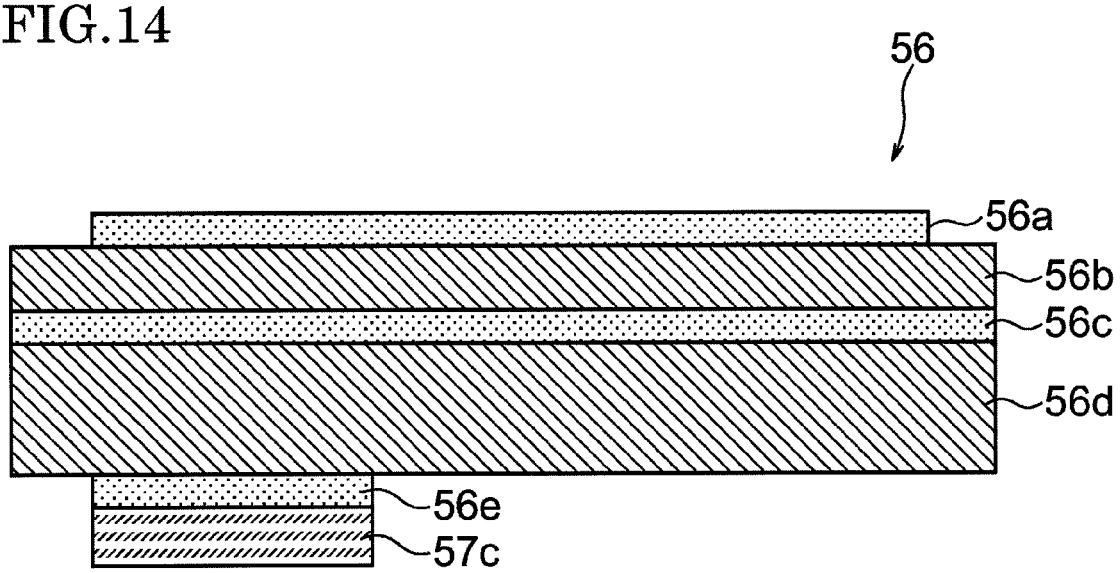
FIG. 14 is a cross-sectional view showing an eighth step of a method of production of a silicon finger contactor in an embodiment of the present invention.

Next, in an eighth step shown in FIG. 14, the resist layer 57c is formed on the surface of the SiO$_2$ layer 56e by the same procedure as the above-mentioned second step.

Figure 15:
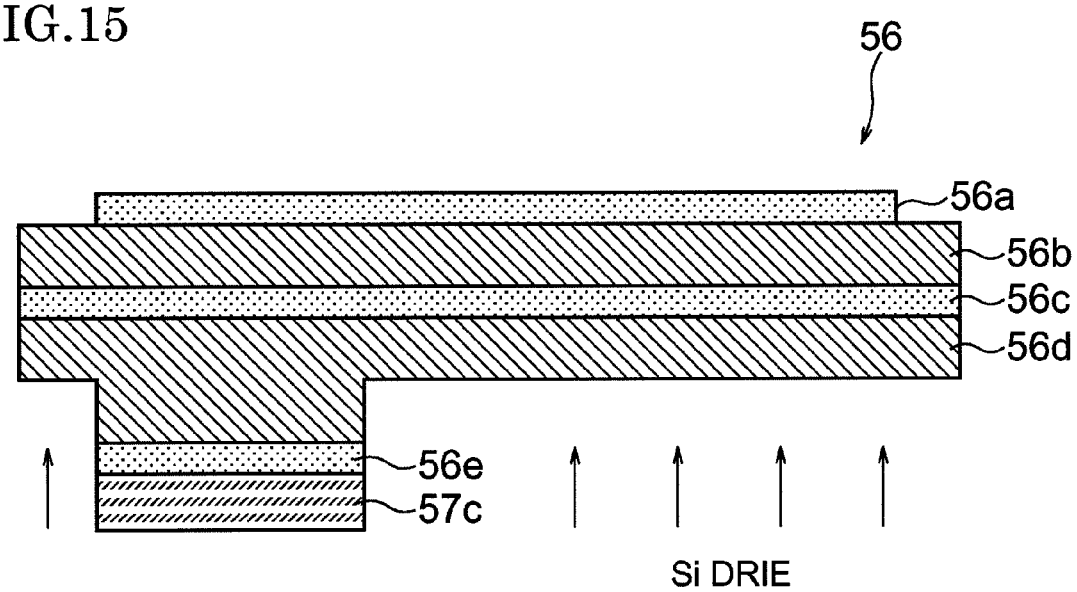
FIG. 15 is a cross-sectional view showing a ninth step of a method of production of a silicon finger contactor in an embodiment of the present invention.

Next, in a ninth step shown in FIG. 15, the Si layer 56d is dry etched from the bottom side in FIG. 15. This dry etching is performed by DRIE (deep reactive ion etching). Further, the Si layer 56d other than parts protected by the resist layer 57c is eroded.

Figure 16:
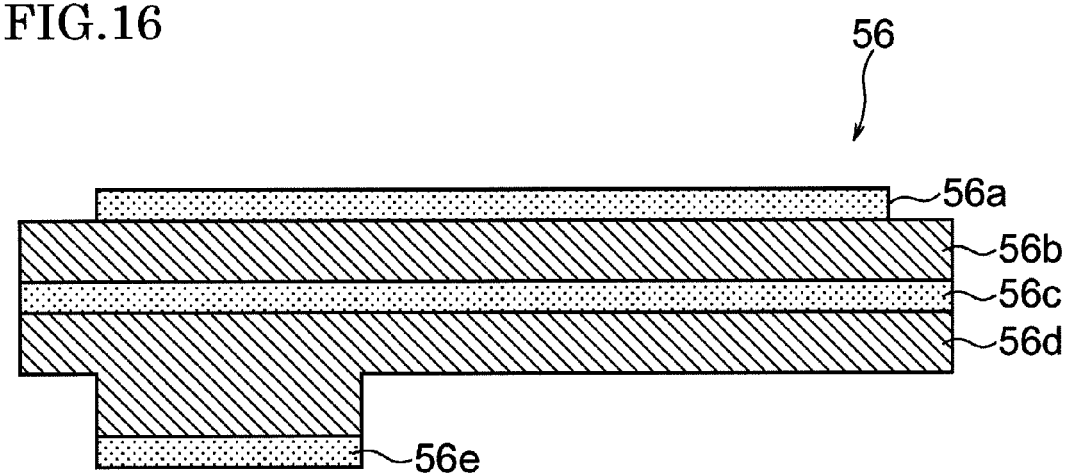
FIG. 16 is a cross-sectional view showing a 10th step of a method of production of a silicon finger contactor in an embodiment of the present invention.

Next, in a 10th step shown in FIG. 16, the resist layer 57c is removed by the same procedure as the above-mentioned fourth step.

Figure 17:
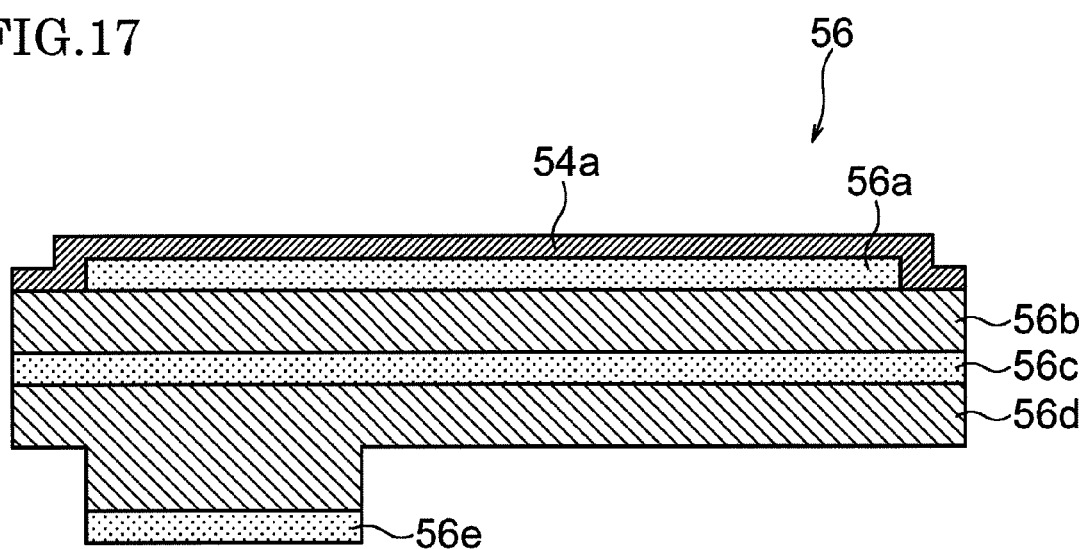
FIG. 17 is a cross-sectional view showing an 11th step of a method of production of a silicon finger contactor in an embodiment of the present invention.

Next, in an 11th step shown in FIG. 17, a seed layer 54a including mainly Ti and Au is formed on the upper front surface of the silicon wafer 56 in FIG. 17 by the sputtering method. This seed layer 54a is used as a power feed layer when forming the later-explained first Au plated layer.

Figure 18:
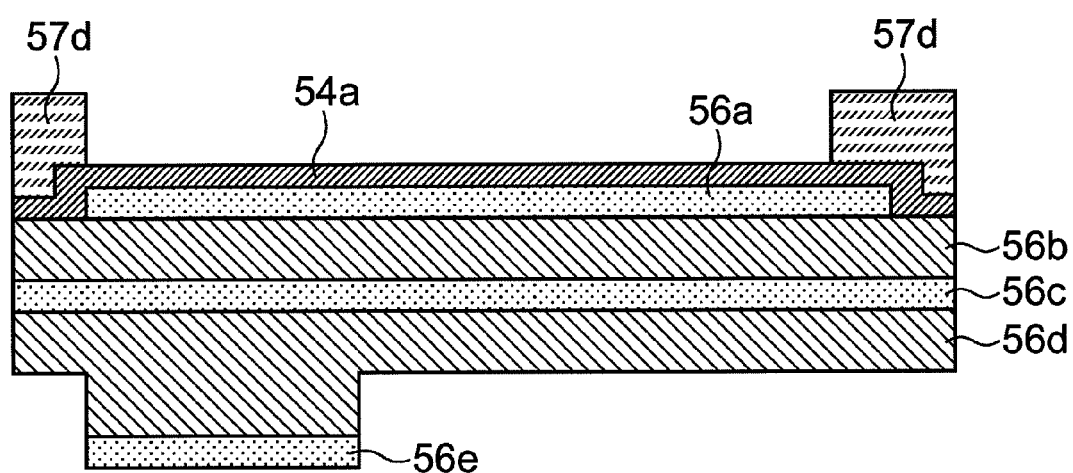
FIG. 18 is a cross-sectional view showing a 12th step of a method of production of a silicon finger contactor in an embodiment of the present invention.

Next, in a 12th step shown in FIG. 18, the resist layer 57d is formed at the front end and rear end of the part that becomes the beam part 53 later in the surface of the seed layer 54a by the same procedure as the above-mentioned second step.

Figure 19:
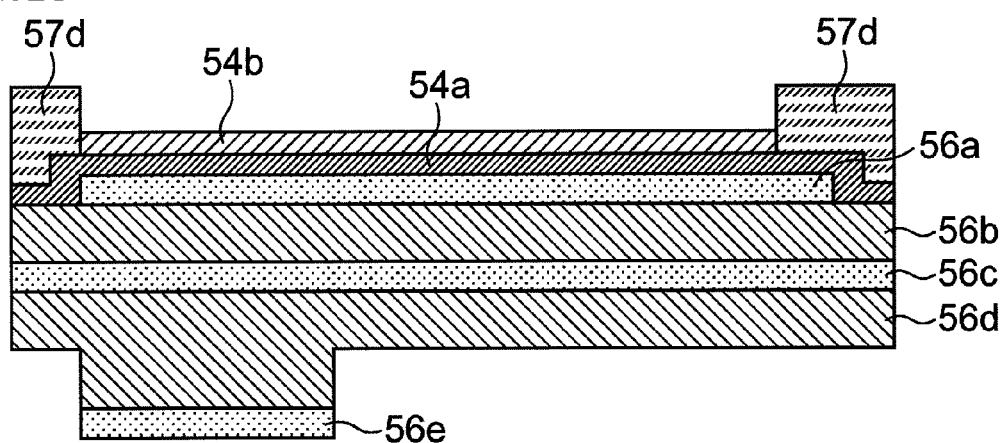
FIG. 19 is a cross-sectional view showing a 13th step of a method of production of a silicon finger contactor in an embodiment of the present invention.

Next, in a 13th step shown in FIG. 19, the first Au plated layer 54b is formed by plating at the part of the surface of the seed layer 54a not covered by the resist layer 57d. This first Au plated layer 54b is formed for electrical connection of the contact part 55 and the rear end high purity Au plated layer 54c in the later formed beam part 53. Au is a material superior in corrosion resistance, difficulty in change of the contact resistance value along with time, solderability, bondability, and conductivity. Further, as explained later, an Ni plated layer 54d having a predetermined size is formed on the front end side surface of the first Au plated layer 54b, so a predetermined mechanical strength is required. For this reason, by the addition of Ni, Co, Cu, or dissimilar types of metals to Au as the material composing this first Au plated layer 54b, the hardness of the Au plated layer 54d is increased to Hv130-200.

Figure 20:
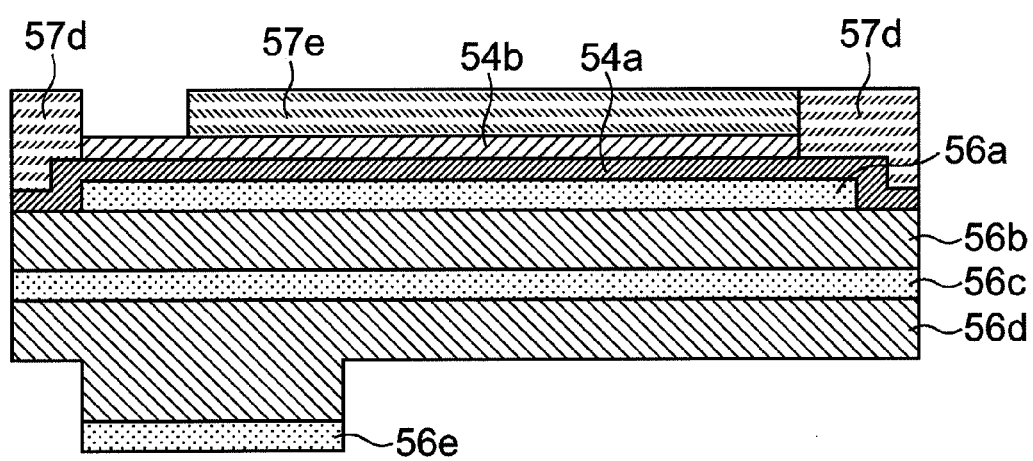
FIG. 20 is a cross-sectional view showing a 14th step of a method of production of a silicon finger contactor in an embodiment of the present invention.

Next, in a 14th step shown in FIG. 20, a resist layer 57e is formed in a continuing series at the front end side (right side in FIG. 20) of the part that becomes the beam part 53 later in the resist layer 57d by the same procedure as the above-mentioned second step.

Figure 21:
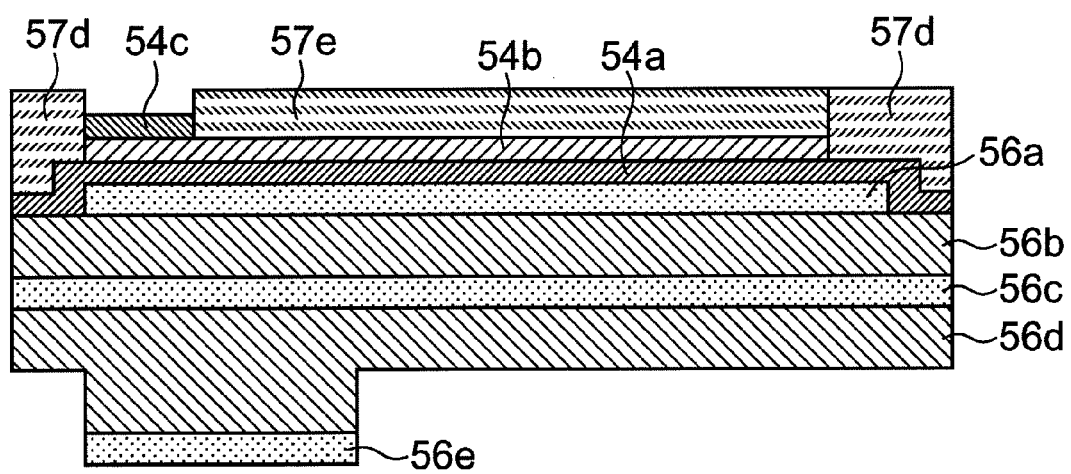
FIG. 21 is a cross-sectional view showing a 15th step of a method of production of a silicon finger contactor in an embodiment of the present invention.

Next, in a 15th step shown in FIG. 21, a high purity Au plated layer 54c is formed at the part of the front surface of the first Au plated layer 54b not covered by the resist layers 57d, 57e. This high purity Au plated layer 54c is composed of 99.99% or more high purity Au of a higher Au purity than the first Au plated layer 54b so as to enable bonding in a later step and have a high conductivity.

Figure 22:
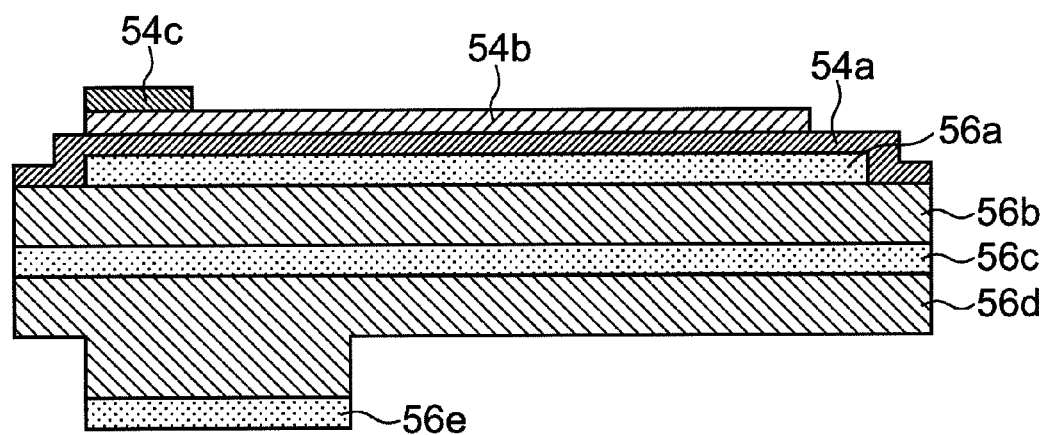
FIG. 22 is a cross-sectional view showing a 16th step of a method of production of a silicon finger contactor in an embodiment of the present invention.

Next, in a 16th step shown in FIG. 22, the resist layers 57d, 57e are removed by the same procedure as in the above-mentioned fourth step.

Figure 23:
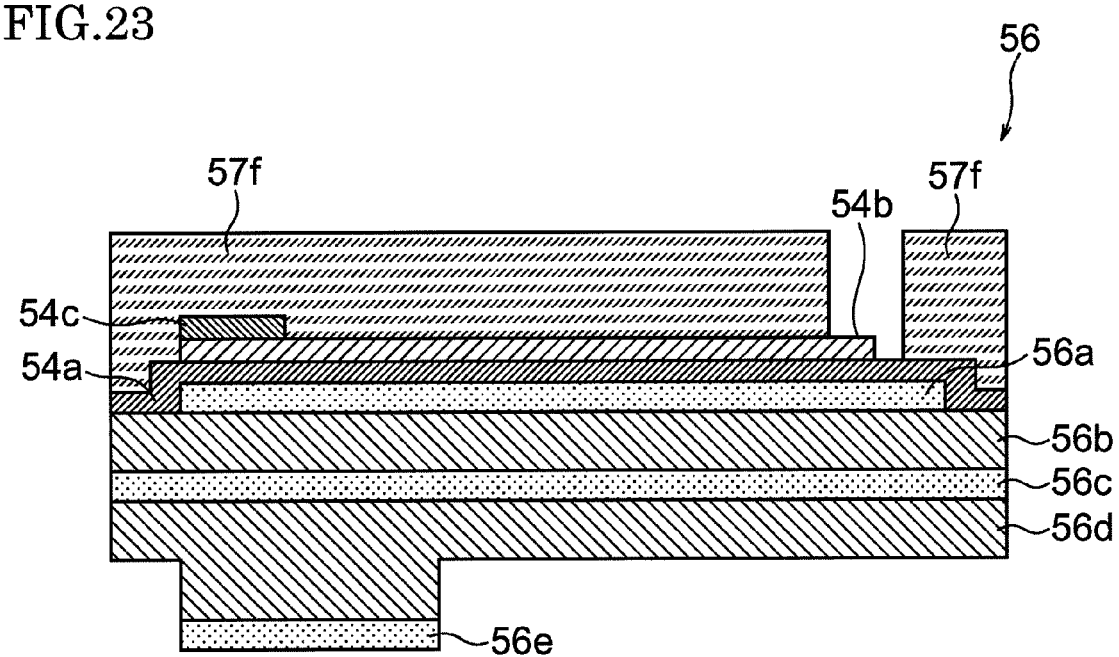
FIG. 23 is a cross-sectional view showing a 17th step of a method of production of a silicon finger contactor in an embodiment of the present invention.

Next, in a 17th step shown in FIG. 23, a resist layer 57f is formed at the part except for the part from the front end of the first Au plated layer 54b to the front surface of the seed layer 54a by the same procedure as the above-mentioned second step. Note that, the resist layer 57f may also be formed at the part except for the part away from the front end of the first Au plated layer 54b in the front end part of the seed layer 54a.

Here, the Ni plated layer 54d formed in the next explained 18th step has to be formed large enough to enable sufficient electrical contact between the IC device and silicon finger contactor 50 through the contact parts 55 when the contact parts 55 are formed based on the Ni plated layer 54d. That is, the Ni plated layer 54d is formed for giving the contact parts 55 a predetermined size. Further, the size of the Ni plated layer 54d is adjusted by the thickness of the resist layer 57f. For this reason, the resist layer 57f has to be thickly formed to an extent having a sufficient size for the Ni plated layer 54d to form the contact parts 55.

Figure 24:
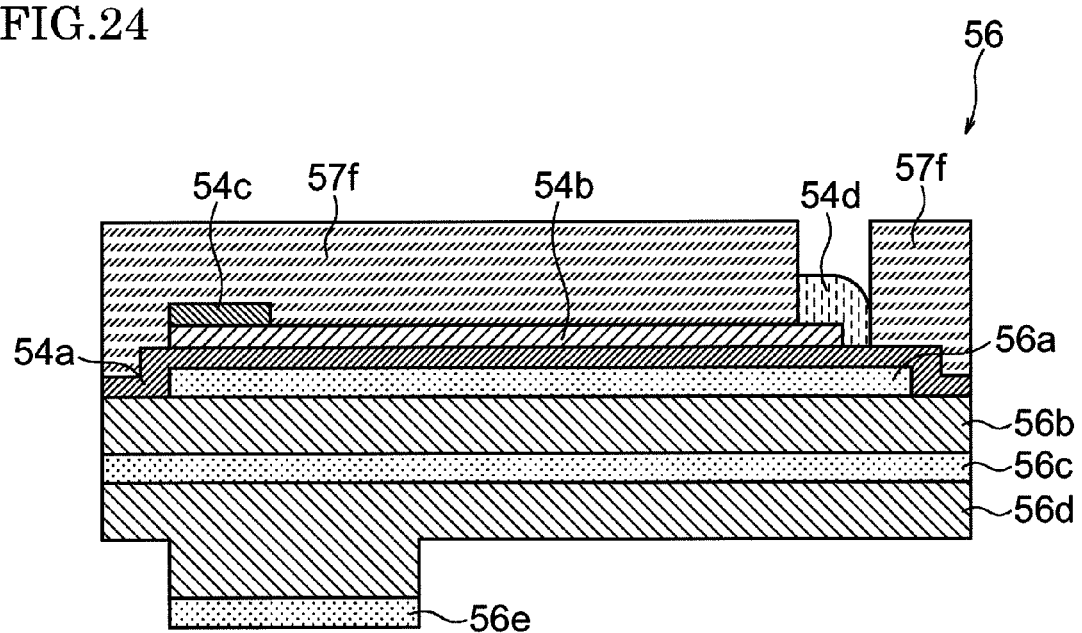
FIG. 24 is a cross-sectional view showing an 18th step of a method of production of a silicon finger contactor in an embodiment of the present invention.

Next, in an 18th step shown in FIG. 24, the part of the surface of the silicon wafer 56 not covered by the resist layer 57f is plated and an Ni plating layer 54d is formed from the front end of the first Au plated layer 54b to the surface of the seed layer 54a. This Ni plated layer 54d is formed near the corner part of the front end of the first Au plated layer 54b, so has a predetermined curvature.

Figure 25:
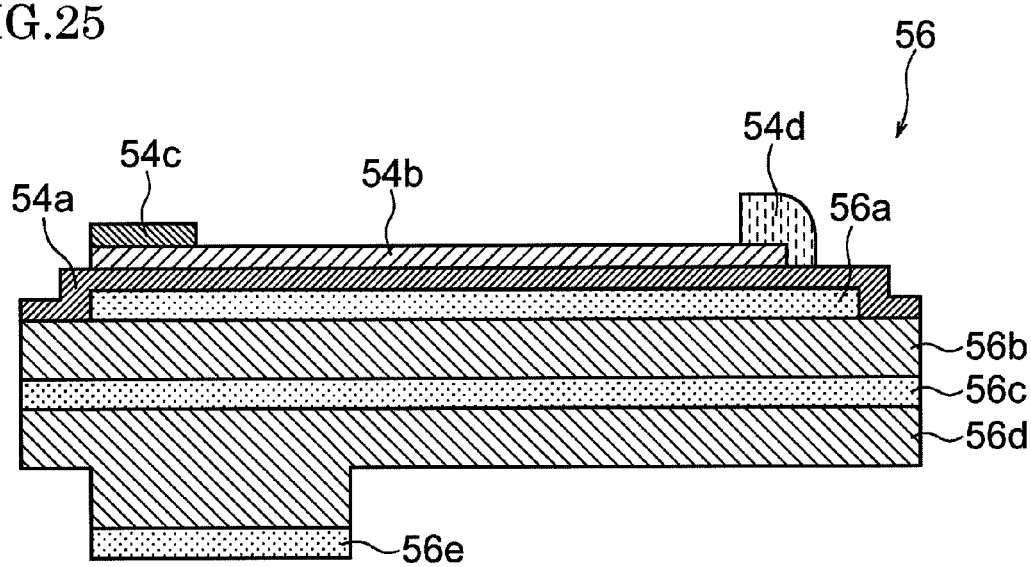
FIG. 25 is a cross-sectional view showing a 19th step of a method of production of a silicon finger contactor in an embodiment of the present invention.

Next, in a 19th step shown in FIG. 25, the resist layer 57f is removed by the same procedure as the above-mentioned fourth step.

Figure 26:
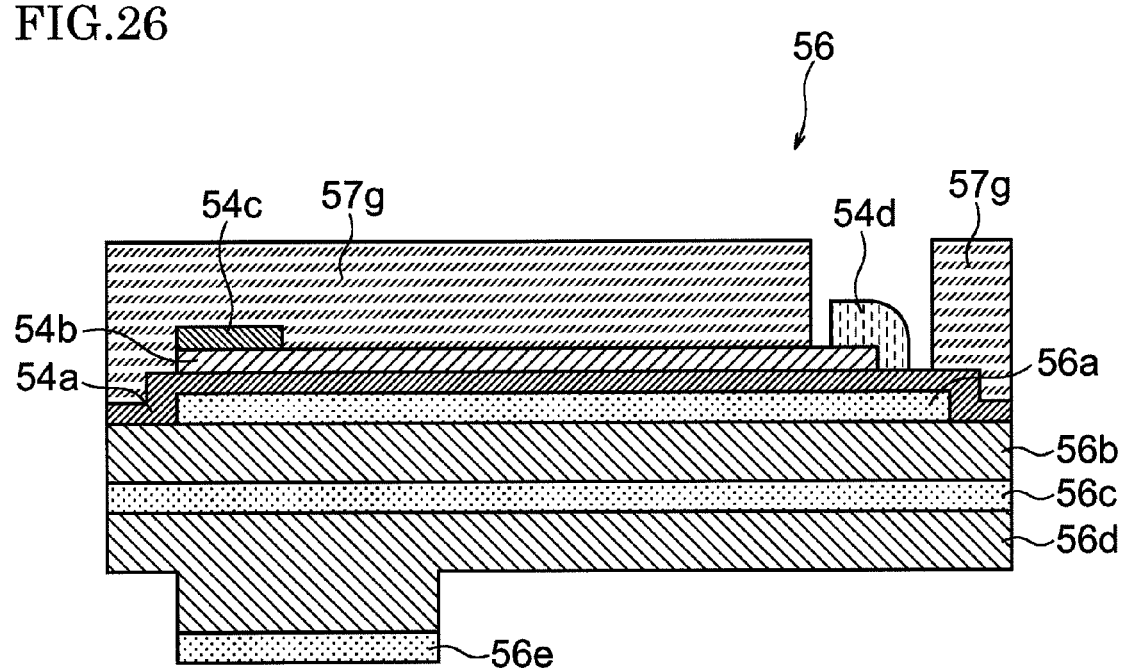
FIG. 26 is a cross-sectional view showing a 20th step of a method of production of a silicon finger contactor in an embodiment of the present invention.

Next, in a 20th step shown in FIG. 26, the resist layer 57g is formed by the same procedure as the above-mentioned second step so as to surround the Ni plated layer 54d leaving a predetermined interval.

Figure 27:
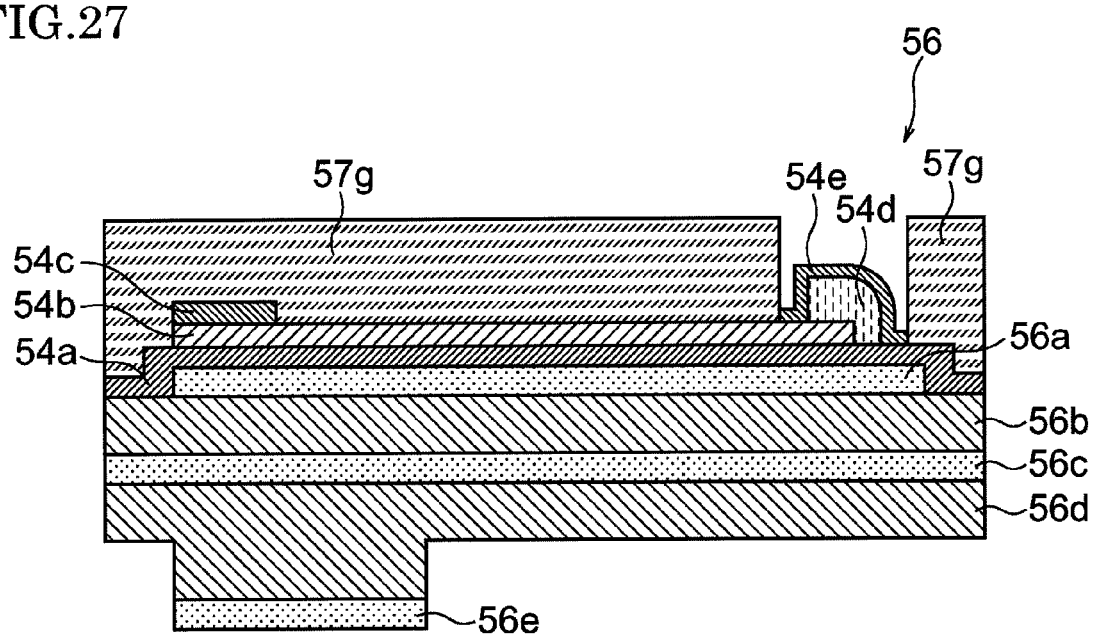
FIG. 27 is a cross-sectional view showing a 21st step of a method of production of a silicon finger contactor in an embodiment of the present invention.

Next, in a 21st step shown in FIG. 27, the second Au plated layer 54e is formed at the part of the upper surface of the silicon wafer 56 not covered by the resist layer 57g in FIG. 26 so as to cover the Ni plated layer 54d. This second Au plated layer 54e is formed for protecting the Ni plated layer 54d from the Rh plating solution in the next explained 22nd step.

Figure 28:
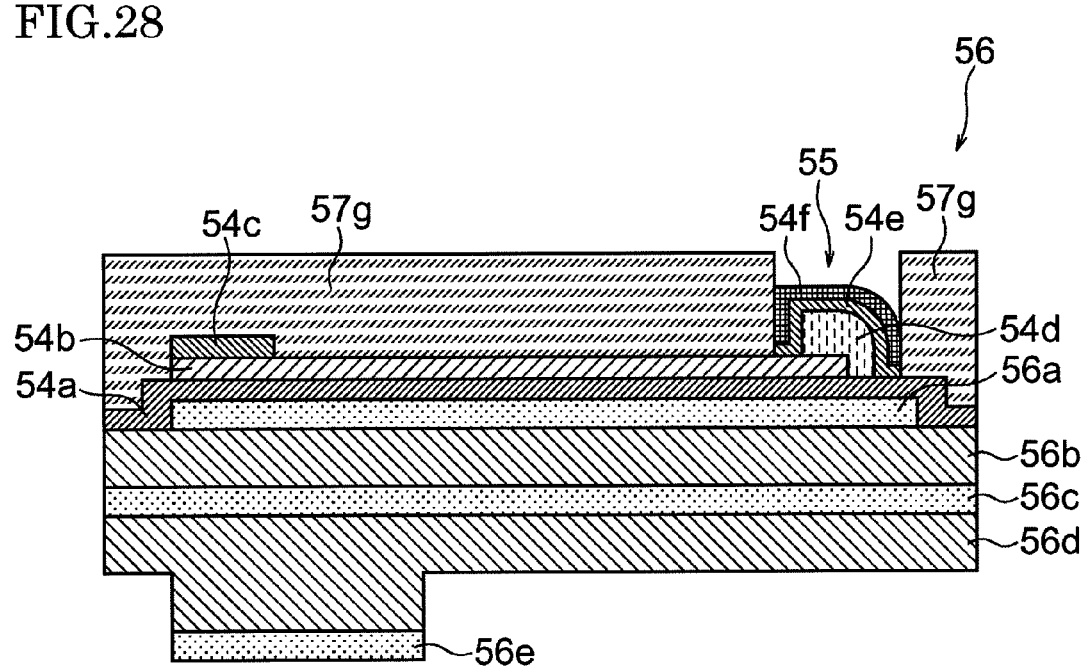
FIG. 28 is a cross-sectional view showing a 22nd step of a method of production of a silicon finger contactor in an embodiment of the present invention.

Next, in a 22nd step shown in FIG. 28, an Rh plated layer 54f is formed at the part of the surface of the second Au plated layer 54e not covered by the resist layer 57g. The Rh plated 54f is a plated layer having an extremely high hardness of Hv800 to 1000 and is superior in corrosion resistance as well. For this reason, the Rh plated layer 54f is very suitable as a material composing the contact part 55 where a stable contact resistance and an abrasion resistance are particularly demanded over the long term.

In this way, the contact parts 55 of the silicon finger contactor 50 is formed. Due to the existence of the contact parts 55, direct contact between the first Au plated layer 54b composed of the soft Au and the IC device can be eliminated at the time of tests. For this reason, it is possible to prevent damage to the first Au plated layer 54b.

Note that, in the present embodiment, the outermost surface of the contact part 55 was composed of an Rh plated layer, but the present invention is not limited to this. It is also possible to use Pt, Ru, Pd, Ir, or another conductive material high in hardness and superior in corrosion resistance. Further, the shape of the Rh plated layer shown in FIG. 5 and the shape of the Rh plated layer shown in FIG. 28 differ as to whether the Rh plated layer covers the entire contact part 55 or not. The shape shown in FIG. 28 enables the number of steps to be reduced.

Figure 29:
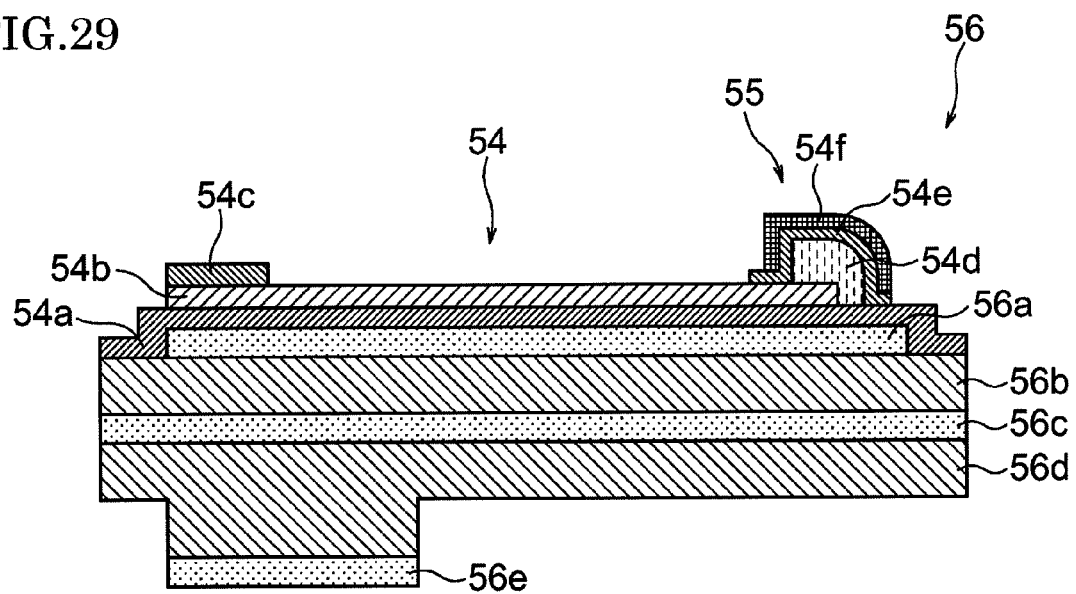
FIG. 29 is a cross-sectional view showing a 23rd step of a method of production of a silicon finger contactor in an embodiment of the present invention.

Next, in a 23rd step shown in FIG. 29, the resist layer 57g is removed by the same procedure as the above-mentioned fourth step.

Figure 30:
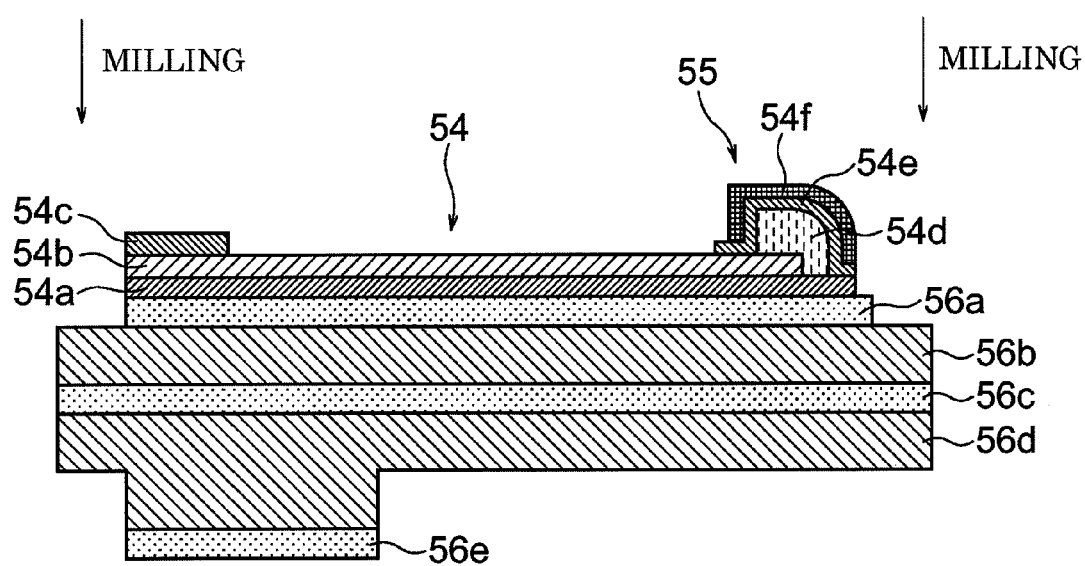
FIG. 30 is a cross-sectional view showing a 24th step of a method of production of a silicon finger contactor in an embodiment of the present invention

Next, the exposed parts of the seed layer 54a required for plating are removed by milling in a 24th step shown in FIG. 30. This milling is performed by firing argon ions at the silicon wafer 56 in a vacuum chamber. The seed layer 54a is thinner than other film structures, so is first removed by this milling. After the exposed parts of the seed layer 54a are removed, the milling is ended.

Figure 31:
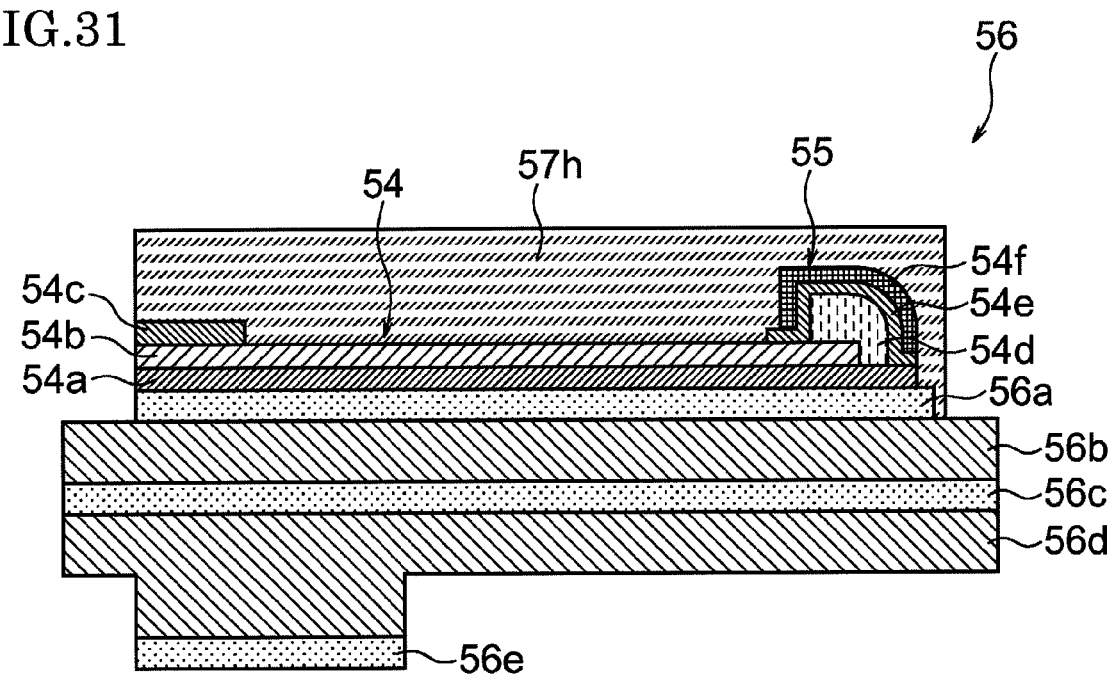
FIG. 31 is a cross-sectional view showing a 25th step of a method of production of a silicon finger contactor in an embodiment of the present invention.

Next, in a 25th step shown in FIG. 31, a resist layer 57h is formed at the part except for where the Si layer 56b is exposed in the surface of the silicon wafer 56 on which the contact parts 55 are formed, by the same procedure as the above-mentioned second step.

Figure 32:
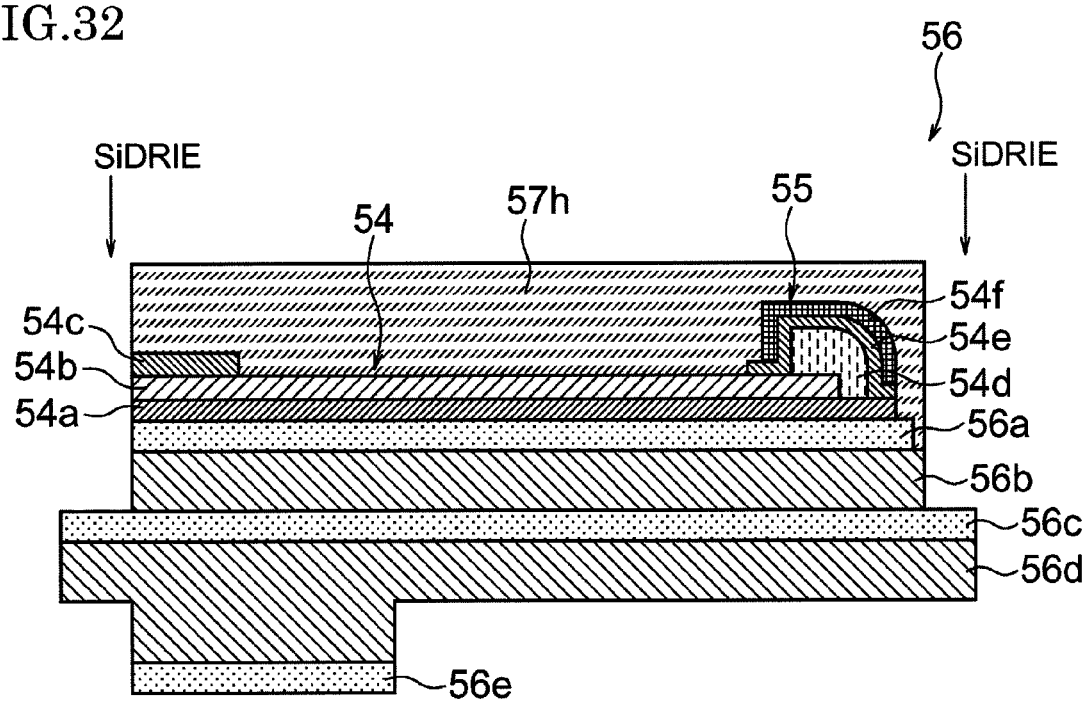
FIG. 32 is a cross-sectional view showing a 26th step of a method of production of a silicon finger contactor in an embodiment of the present invention.

Next, etching by DRIE is performed from the side at which the resist layer 57h is formed, and the Si layer 56b is shaped into fingers (comb shape) in a 26th step shown in FIG. 32. This shaping of the silicon wafer 56 by DRIE does not reach the Si layer 56d since the $SiO_2$ layer 56c functions as a stop layer.

Note that, this etching is performed so that a scallop value (roughness of surface relief of side walls formed by etching) of the beam part 53 is 100 nm or less. This is to effectively prevent cracks or damage from occurring at the parts of rough surface shape of the side wall due to stress when the beam part 53 elastically deforms at the time of testing an IC device.

Figure 33:
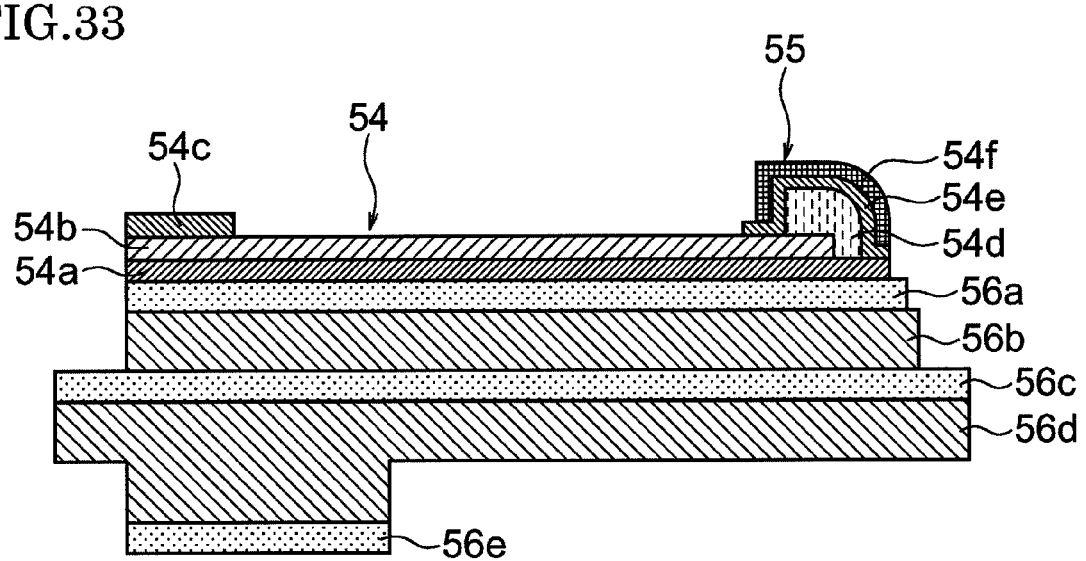
FIG. 33 is a cross-sectional view showing a 27th step of a method of production of a silicon finger contactor in an embodiment of the present invention.

Next, in a 27th step shown in FIG. 33, the resist layer 57h is removed by the same procedure as the above-mentioned fourth step.

Figure 34:
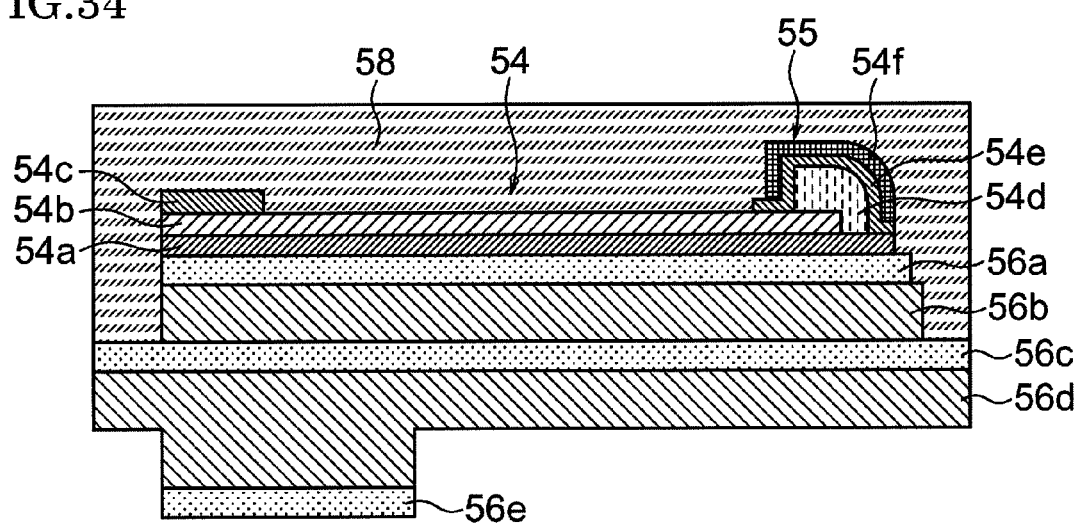
FIG. 34 is a cross-sectional view showing a 28th step of a method of production of a silicon finger contactor in an embodiment of the present invention.

Next, in a 28th step shown in FIG. 34, a polyimide layer 58 is formed on the entire surface of the silicon wafer 56 on which the contact parts 55 are formed. Polyimide is a substance extremely superior in heat resistance, corrosion resistance, insulation, and mechanical strength. This polyimide layer 58 is formed by coating a polyimide precursor using a spin coater, a spray coater, etc. on the entire surface of the wafer 56, then heating to 200° C. or more or using a catalyst for imidization. The beam parts 53 of the silicon finger contactor 50 are completely formed into finger shapes (comb shape) by the through etching performed in the later 29th and 30th steps. At this time, if there is no polyimide layer 58, when the silicon wafer 56 is passed through slightly, the stage of the DRIE apparatus ends up being exposed via the through hole. Further, if the stage is exposed, cooling gas sprayed from the stage side to the wafer 56 ends up leaking out via the through hole and ends up no longer being able to sufficiently cool the wafer 56. Further, if the stage is exposed via the through hole, DRIE will end up damaging the stage body.

For this reason, in order to prevent leakage of the cooling gas and damage to the stage body, the polyimide layer 58 is formed in the 28th step.

Figure 35:
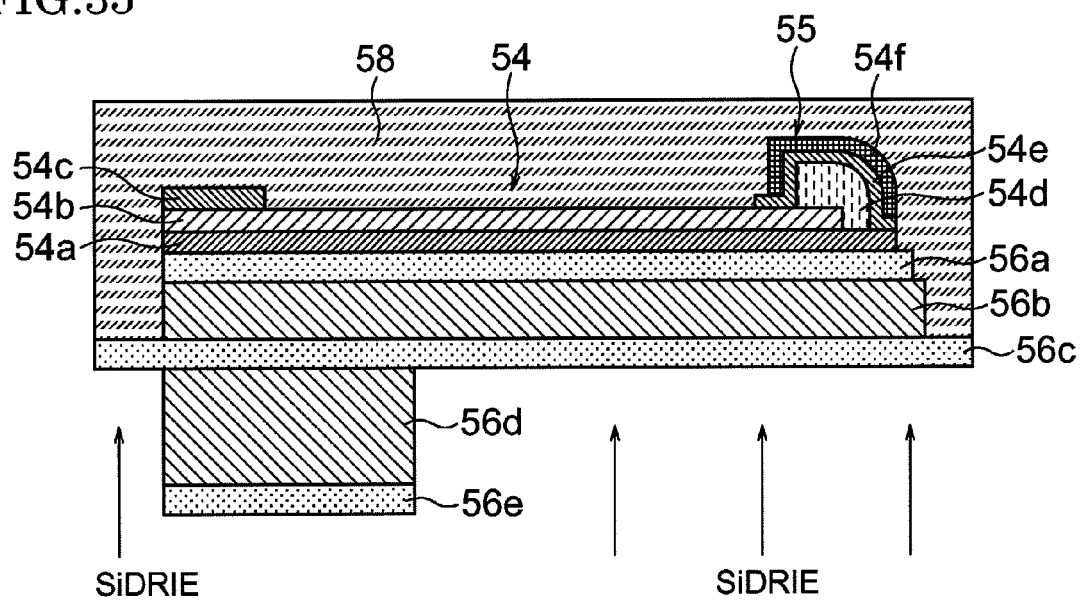
FIG. 35 is a cross-sectional view showing a 29th step of a method of production of a silicon finger contactor in an embodiment of the present invention.

Next, in a 29th step shown in FIG. 35, etching is performed by DRIE from the opposite side of the surface on which the polyimide layer 58 is formed. The erosion of the Si layer 56d by this DRIE does not reach the Si layer 56b since the $SiO_2$ layer 56c functions as a stop layer.

Figure 36:
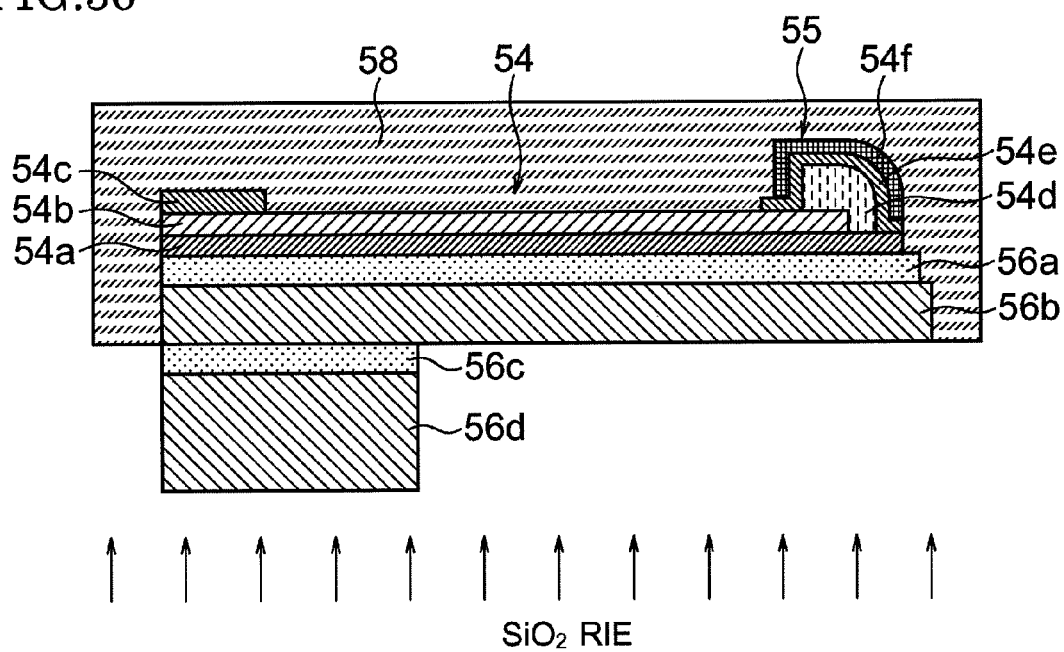
FIG. 36 is a cross-sectional view showing a 30th step of a method of production of a silicon finger contactor in an embodiment of the present invention.

Next, in a 30th step shown in FIG. 36, the $SiO_2$ layers 56c, 56e are etched by RIE (Reactive Ion Etching) to remove the $SiO_2$ layers 56c, 56e. Due to this, the beam parts 53 of the silicon finger contactor 50 are completely formed to finger shapes (comb shape). Further, the now unnecessary polyimide layer 58 is removed by a strongly alkali separation solution.

Note that, in the present embodiment, a polyimide precursor was directly coated on the wafer 56, then imidized to obtain the polyimide layer 58. However, the present invention is not limited to this. As the polyimide layer 58, the polyimide film may also be stuck on the wafer 56 using an alkali soluble tackifier. In this case, when the polyimide layer 58 becomes unnecessary, the polyimide film is quickly removed by using an alkaline stripper.

Further, in the present embodiment, the through etching for forming the beam parts 53 was performed by RIE, but the present invention is not limited to this. It is also possible to use the Bosch method etc.

Figure 37:
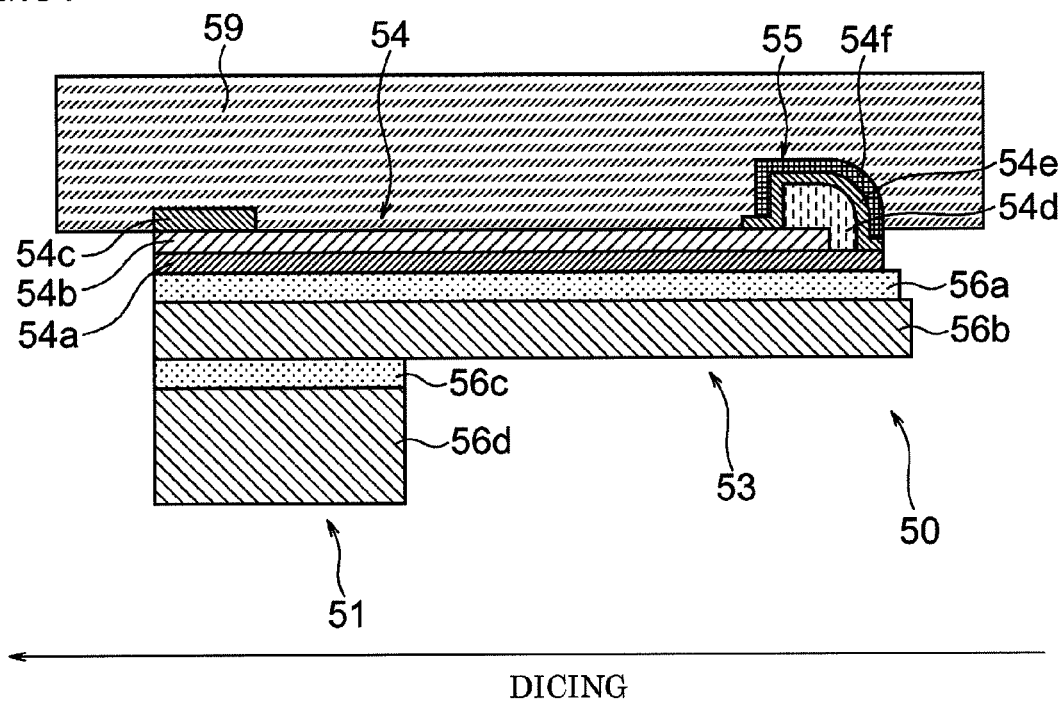
FIG. 37 is a cross-sectional view showing a 31st step of a method of production of a silicon finger contactor in an embodiment of the present invention.

Next, in a 31st step shown in FIG. 37, a foaming separation tape 59 is stuck on the surface from which the polyimide layer 58 was removed and on which the contact parts 55 of the silicon finger contactor 50 is formed (top surfaces of beam parts 53) and the wafer is diced.

This dicing is performed so as to cut the silicon wafer 56 in which a large number of silicon finger contactors 50 are built and separate it into shapes of individual silicon finger contactors 50 to be mounted on the probe board 41.

The foaming separation tape 59 is stuck to protect each silicon finger contactor 50 so that the beam part 53 does not break due to water pressure at the time of this dicing.

The foaming separation tape 59 is composed of a substrate tape containing PET on one side of which a UV foaming tackifier foaming by UV irradiation is coated. The UV foaming tackifier sticks to a silicon substrate etc. in the state not yet irradiated by UV, but foams when irradiated by UV. Further, the contact area of the UV foaming tackifier and silicon substrate etc. is reduced, so the tack strength of the foaming separation tape 59 weakens. For this reason, after UV irradiation, the foaming separation tape 59 becomes a state where it can be easily peeled off from the silicon substrate etc.

After this dicing, the silicon finger contactor 50 shown in FIG. 5 is completed.

Figure 38:
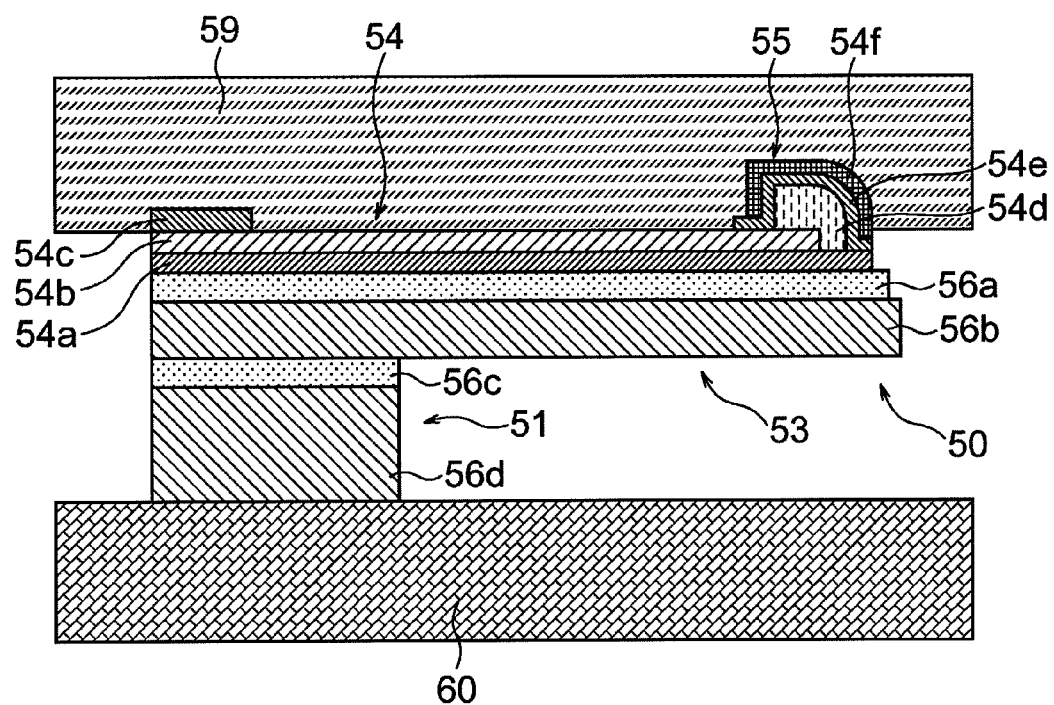
FIG. 38 is a cross-sectional view showing a 32nd step of a method of production of a silicon finger contactor in an embodiment of the present invention.

Next, in a 32nd step shown in FIG. 38, to facilitate the handling of the diced silicon finger contactor 50, UV separation tape 60 is stuck on the surface (bottom surface of base part 51) of the silicon finger contactor 50 opposite to the surface where the foaming separation tape 59 is stuck.

The UV separation tape 60 is composed of a substrate tape containing polyolefin on one side of which a UV curing tackifier including acrylic and curing due to UV irradiation. A UV curing tackifier has tackiness in the state before UV irradiation and sticks on a silicon substrate etc., but has the property of curing and losing tackiness when irradiated by UV. For this reason, the UV separation tape 60 is easily peeled off from the silicon substrate etc. by UV irradiation.

Figure 39:
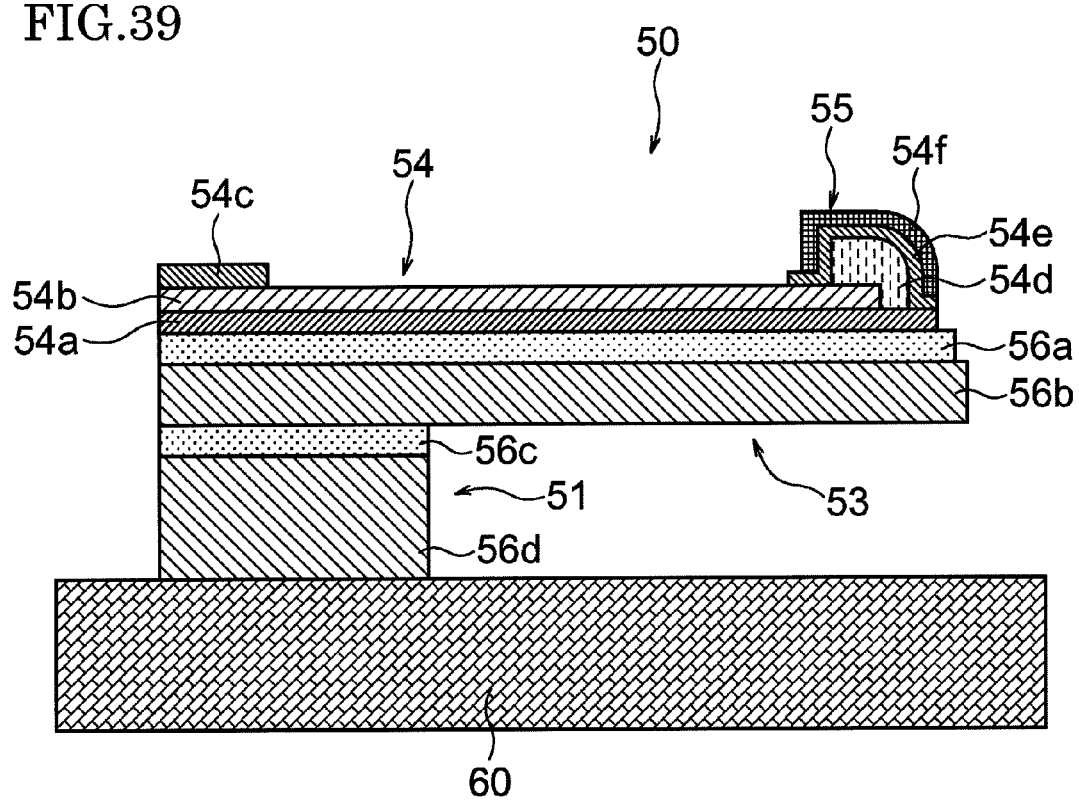
FIG. 39 is a cross-sectional view showing a 33rd step of a method of production of a silicon finger contactor in an embodiment of the present invention.

Next, in a 33rd step shown in FIG. 39, the UV foaming tackifier of the foaming separation tape 59 is foamed by irradiating UV, and the foaming separation tape 59 is peeled off the silicon finger contactor 50.

Next, the silicon finger contactor 50 is picked up by a not shown pickup apparatus. At this time, UV is irradiated to the UV curing separation tape 60 side in the state of holding the silicon finger contactor 50 by the pickup apparatus, and so the UV curing separation tape 60 is peeled off from the silicon finger contactor 50.

Next, the pickup apparatus arranges the silicon finger contactor 50 at a predetermined position of a probe card 40. Further the silicon finger contactor 50 is fixed by an adhesive to the probe card 40 at the position.

In this way, a probe card 40 carrying a silicon finger contactor 50 of the present embodiment is completed.

Note that, the above explained embodiment was described for facilitating understanding of the present invention and was not described for limiting the present invention. Therefore, the elements disclosed in the above embodiment include all design changes and equivalents falling under the technical scope of the present invention.

Figure 40A:
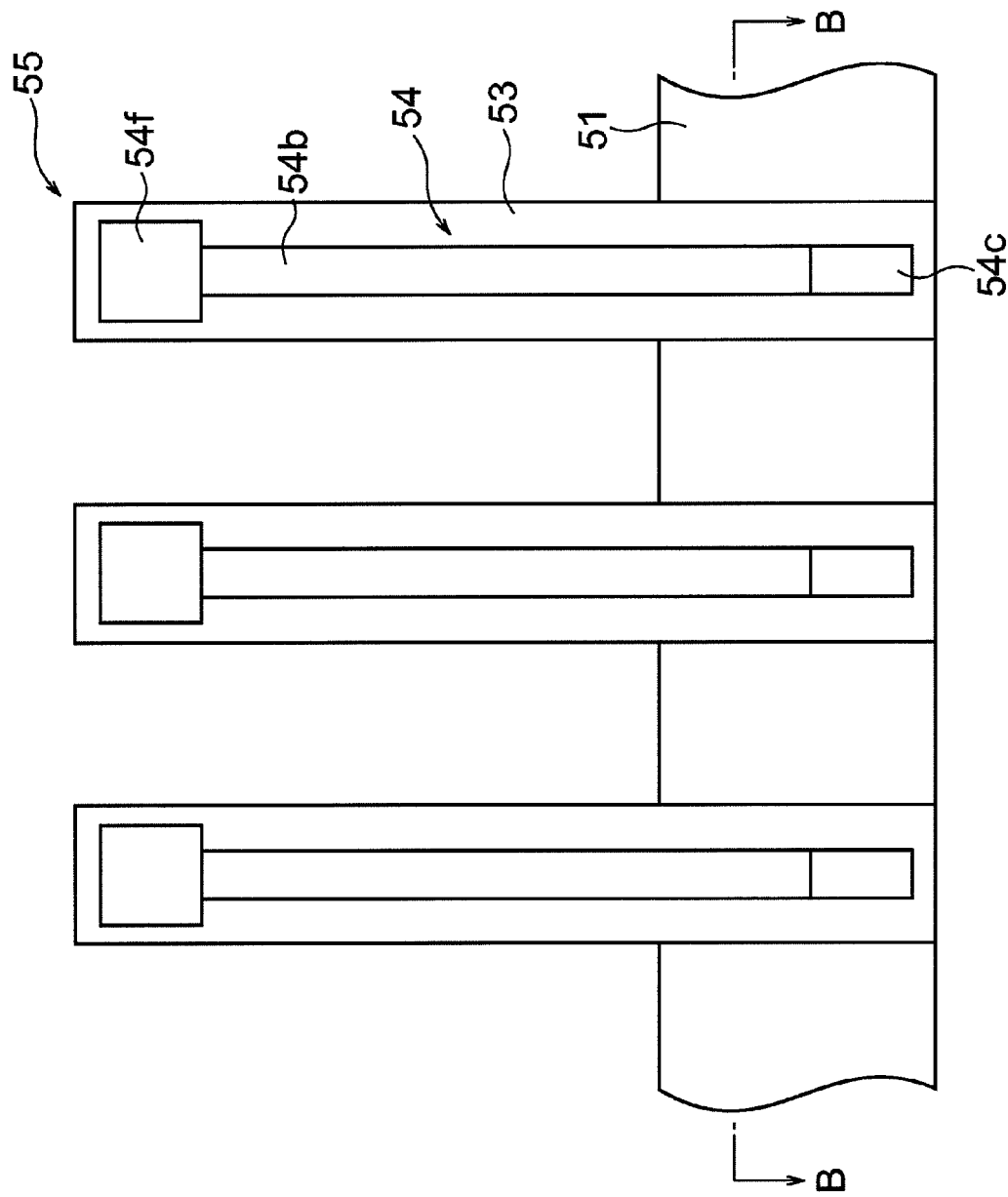
FIG. 40A is a plan view showing another shape of the silicon finger contactor shown in FIG. 5.
Figure 40B:
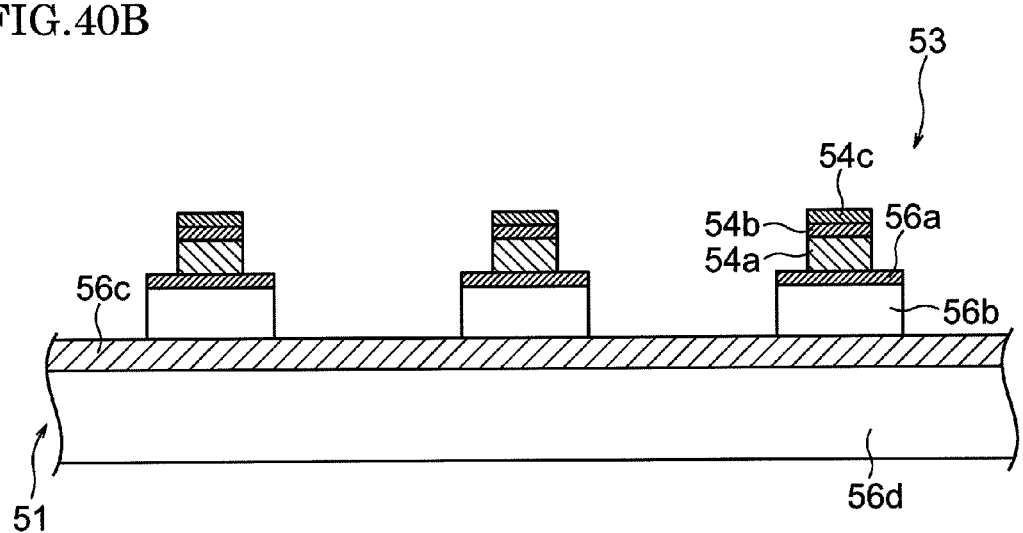
FIG. 40B is a cross-sectional view along the line B-B of FIG. 40A.

For example, in the present embodiment, the silicon finger contactor 50 is provided with tapered diagonal columnar beam parts 53 such as shown in FIG. 6, but in the present invention, the shape of the beam parts 53 is not limited to this. As shown in FIGS. 40A and 40B, the beam parts 53 may also be straight columnar shapes and their front ends may also be provided with contact parts 55. Further, as shown in the drawings, the rear end sides of the beam parts 53 may also be cut away to the same width as the front end sides to improve the high frequency characteristics of the contactor or disperse stress to raise the elasticity limit at the time of elastic deformation.

Figure 41:
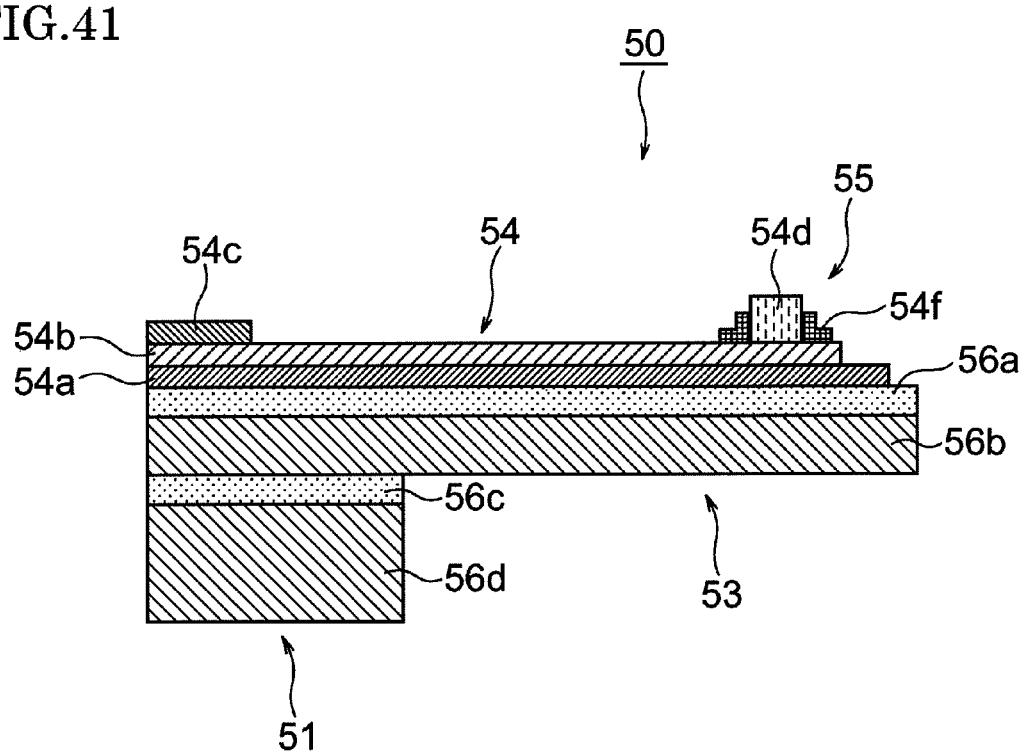
FIG. 41 is a cross-sectional view showing still another shape of the silicon finger contactor in an embodiment of the present invention.

Further, in the above embodiment, the contact parts 55 were composed of three layers of the Ni plated layer 54d, second Au plated layer 54e, and Rh plated layer 54f, but the present invention is not particularly limited to this. For example, as shown in FIG. 41, an Rh plated layer 54f may be formed so as to cover only the contacting portion between the Ni plated layer 54d and first Au plated layer 54b. Due to this, it is possible to improve the adhesion of the Ni plated layer 54d to the first Au plated layer 54b.

The invention claimed is:

1. A contactor for contacting an input/output terminal provided at a device under test for establishing electrical connection with the device under test at the time of testing the device under test, the contactor comprising:
   a silicon layer composing at least a part of a beam part with a rear end side provided at a base part and with a front end side sticking out from the base part;
   an insulating layer formed on the silicon layer;
   a conductive layer formed on the insulating layer; and
   a contact part positioned at a front end of the conductive layer and contacting the input/output terminal of the device under test,
   wherein the conductive layer includes:
      a seed layer formed on the insulating layer; and
      a first Au plated layer formed on the seed layer, and
   wherein the contact part comprises a first plated layer which is composed of Ni and which is formed on a step portion between the seed layer and the first Au plated layer.

2. The contactor as set forth in claim 1, wherein at least a surface of the contact part is composed of a conductive material harder than Au composing a first Au plated layer.

3. The contactor as set forth in claim 1, wherein the contact part is formed in the shape of a curved surface.

4. The contactor as set forth in claim 1, wherein the contact part swells up with respect to the conductive layer.

5. The contactor as set forth in claim 1, wherein the contact part has a second plated layer covering at least a contacting portion between the first plated layer and the conductive layer.

6. The contactor as set forth in claim 5, wherein the second plated layer is composed of Rh, Pt, Ru, Pd, or Ir.

7. The contactor as set forth in claim 5, wherein
   the second plated layer covers the entire first plated layer, and
   the contact part further has a third plated layer covering the second plated layer.

8. The contactor as set forth in claim 7, wherein
   the second plated layer is composed of Au, and
   the third plated layer is composed of Rh, Pt, Ru, Pd, or Ir.

9. The contactor as set forth in claim 1, wherein the insulating layer has a thickness of 1 μm or more.

10. The contactor as set forth in claim 1, wherein
    the conductive layer has a second Au plated layer formed on the first Au plated layer at the rear end side of the beam part, and
    the Au purity of the second Au plated layer is higher than the Au purity of the first Au plated layer.

11. A probe card comprising:
    probe needles for electrical contact with input/output terminals of a device under test built into a semiconductor wafer when testing the device under test; and
    a board on which a large number of the probe needles are mounted, wherein
    the probe needles are composed of the contactors as set forth in claim 1.

12. An electronic device test apparatus for testing a semiconductor device formed on a semiconductor wafer, the electronic device test apparatus comprising:
    the probe card as set forth in claim 11;
    a test head electrically connected to the probe card; and
    a prober moving the semiconductor wafer relative to the probe card.

13. A method of production of a contactor for contacting an input/output terminal provided at a device under test for establishing electrical connection with the device under test when testing the device under test,
    the method of production of the contactor comprising:
       etching a silicon wafer so as to form a silicon layer composing at least a part of a beam part with a rear end part provided at a base part and with a front end side sticking out from the base part;
       forming an insulating layer on a surface of the silicon layer;
       forming a conductive layer on the insulating layer;
       forming a contact part contacting the input/output terminal of the device at a front end of the conductive layer,
       wherein forming the conductive layer includes:
          forming a seed layer on the insulating layer, and
          forming a first Au plated layer on the seed layer, and
       wherein the contact part comprises a first plated layer which is composed of Ni and which is formed on a step portion between the seed layer and the first Au plated layer.

14. The method of production of the contactor as set forth in claim 13, wherein at least the surfaces of the contact part is composed of a conductive material harder than Au composing a first Au plated layer.

15. The method of production of the contactor as set forth in claim 13, wherein forming the contact part includes plating at least from the front end part of the first Au plated layer to the surface of the seed layer by Ni plating so as to form the first plating layer composed of Ni having a curved shape.

16. The method of production of the contactor as set forth in claim 15, wherein forming the contact part further includes forming a second plated layer covering at least a contacting portion between the first plated layer and the conductive layer by plating.

17. The method of production of the contactor as set forth in claim 16, wherein the second plated layer is composed of Rh, Pt, Ru, Pd, or Ir.

18. The method of production of the contactor as set forth in claim 16, wherein
    forming the second plated layer is forming the second plated layer so as to cover the entire first plated layer, and
    forming the contact part further includes plating the second plated layer to form a third plated layer.

19. The method of production of the contactor as set forth in claim 18, wherein the second plated layer is composed of Au, and the third plated layer is composed of Rh, Pt, Ru, Pd, or Ir.

20. The method of production of the contactor as set forth in claim 18, wherein the second plated layer and the third plated layer are consecutively formed without removing the resist used for forming the second plated layer.

21. The method of production of the contactor as set forth in claim 13, further comprising milling the seed layer so as to remove an exposed part of the seed layer.

22. The method of production of the contactor as set forth in claim 13, wherein forming the silicon layer comprises performing the etching so that a scallop value of the silicon layer is 100 nm or less.

23. The method of production of the contactor as set forth in claim 13, wherein a polyimide layer is formed as a resist on the top surface of the beam part, and the etching is performed from a bottom surface side of the silicon layer.

24. The method of production of the contactor as set forth in claim 23, wherein the polyimide layer is formed by forming a polyimide precursor layer on the top surface of the beam part and imidizing the polyimide precursor layer.

25. The method of production of the contactor as set forth in claim 23, wherein the polyimide layer is formed by sticking a polyimide film on the top surface of the beam part using a tackifier.

26. The method of production of the contactor as set forth in claim 13, further comprising:

sticking a first tape on the top surface of the beam part; and cutting the silicon wafer in the state where the first tape is stuck on the top surface of the beam part.

27. The method of production of the contactor as set forth in claim 26, wherein the first tape is ultraviolet light foaming tape with a tackifier which foams by irradiation of ultraviolet light, and the method further comprises separating the first tape by irradiation of ultraviolet light.

28. The method of production of the contactor as set forth in claim 26, further comprising sticking a second tape on a bottom surface of the base part.

29. The method of production of the contactor as set forth in claim 28, wherein the second tape is ultraviolet light separation tape with a tackifier curing by irradiation of ultraviolet light, and the method further comprises separating the second tape by irradiation of ultraviolet light.

30. The method of production of the contactor as set forth in claim 13, wherein the silicon layer has 1 k$\Omega$·m or more resistivity.

* * * * *